United States Patent
Pala et al.

(10) Patent No.: US 9,236,433 B2
(45) Date of Patent: Jan. 12, 2016

(54) SEMICONDUCTOR DEVICES IN SIC USING VIAS THROUGH N-TYPE SUBSTRATE FOR BACKSIDE CONTACT TO P-TYPE LAYER

(71) Applicant: Cree, Inc., Durham, NC (US)

(72) Inventors: Vipindas Pala, Morrisville, NC (US); Edward Robert Van Brunt, Raleigh, NC (US); Daniel Jenner Lichtenwalner, Raleigh, NC (US); Lin Cheng, Chapel Hill, NC (US); Anant Kumar Agarwal, Arlington, VA (US); John Williams Palmour, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 14/050,727

(22) Filed: Oct. 10, 2013

(65) Prior Publication Data

US 2015/0102361 A1    Apr. 16, 2015

(51) Int. Cl.

| H01L 29/15 | (2006.01) |
|---|---|
| H01L 29/16 | (2006.01) |
| H01L 29/66 | (2006.01) |
| H01L 29/78 | (2006.01) |
| H01L 29/732 | (2006.01) |
| H01L 29/739 | (2006.01) |
| H01L 29/744 | (2006.01) |
| H01L 29/06 | (2006.01) |

(52) U.S. Cl.
CPC ........ *H01L 29/1608* (2013.01); *H01L 29/0619* (2013.01); *H01L 29/0696* (2013.01); *H01L 29/66068* (2013.01); *H01L 29/66333* (2013.01); *H01L 29/732* (2013.01); *H01L 29/7395* (2013.01); *H01L 29/744* (2013.01); *H01L 29/78* (2013.01)

(58) Field of Classification Search
CPC .................. H01L 21/02381; H01L 21/02447; H01L 21/02529; H01L 29/1608; H01L 29/66068
USPC .............................................. 257/77, E21.054
See application file for complete search history.

(56) References Cited

U.S. PATENT DOCUMENTS

| 6,084,264 A * | 7/2000 | Darwish ........................ 257/329 |
| 2010/0224886 A1 * | 9/2010 | Iwamuro ......................... 257/77 |

OTHER PUBLICATIONS

Tsao, B.-H. et al., "Improved AlNi Ohmic Contacts to P-Type SiC," Materials Science Forum, vols. 457-460, Copyright: 2004, pp. 841-844.

* cited by examiner

*Primary Examiner* — Brook Kebede
(74) *Attorney, Agent, or Firm* — Anthony J. Josephson

(57) ABSTRACT

A Silicon Carbide (SiC) semiconductor device having back-side contacts to a P-type region and methods of fabrication thereof are disclosed. In one embodiment, an SiC semiconductor device includes an N-type substrate and an epitaxial structure on a front-side of the N-type substrate. The epitaxial substrate includes a P-type layer adjacent to the N-type substrate and one or more additional SiC layers on the P-type layer opposite the N-type substrate. The semiconductor device also includes one or more openings through the N-type substrate that extend from a back-side of the N-type substrate to the P-type layer and a back-side contact on the back-side of the N-type substrate and within the one or more openings such that the back-side contact is in physical and electrical contact with the P-type layer. The semiconductor device further includes front-side contacts on the epitaxial structure opposite the N-type substrate.

25 Claims, 20 Drawing Sheets

US 9,236,433 B2

SEMICONDUCTOR DEVICES IN SIC USING VIAS THROUGH N-TYPE SUBSTRATE FOR BACKSIDE CONTACT TO P-TYPE LAYER

GOVERNMENT SUPPORT

This invention was made with government funds under contract number W911 NF-10-2-0038 awarded by the Army. The U.S. Government may have rights in this invention.

FIELD OF THE DISCLOSURE

The present disclosure relates to semiconductor devices and more particularly relates to vertical semiconductor devices formed in Silicon Carbide (SiC) having a P-type backside contact layer (e.g., an N-channel Insulated Gate Bipolar Transistor (IGBT), an N-channel Gate Turn-Off thyristor (GTO), an N-channel thyristor, a PNP Bipolar Junction Transistor (BJT), or a P-channel Metal Oxide Semiconductor Field Effect Transistor (MOSFET)).

BACKGROUND

Silicon Carbide (SiC) power devices provide superior performance over power devices formed in other material systems. In particular, SiC power devices have numerous advantages over Silicon (Si) power devices such as, for example, higher breakdown field (~10×) and thus, for the same breakdown voltage, lower specific on-resistance and faster switching; higher thermal conductivity (~3×) and thus higher current densities; and higher bandgap (~3×) and thus higher temperature of operation. Power devices are typically vertical devices. As such, current flows through a vertical power device between one contact on a front-side of the power device and another contact on a back-side of the power device.

SUMMARY

Embodiments of a Silicon Carbide (SiC) semiconductor device having back-side contacts to a P-type region and methods of fabrication thereof are disclosed. In one embodiment, an SiC semiconductor device includes an N-type SiC substrate and an epitaxial structure on a front-side of the SiC substrate. The epitaxial substrate includes a P-type SiC layer adjacent to the N-type SiC substrate and one or more additional SiC layers on the P-type SiC layer opposite the N-type SiC substrate. The semiconductor device also includes one or more openings through the N-type substrate that extend from a back-side of the N-type substrate to the P-type SiC layer and a back-side contact on the back-side of the N-type substrate and within the one or more openings such that the back-side contact is in physical and electrical contact with the P-type SiC layer. The semiconductor device further includes front-side contacts on the epitaxial structure opposite the N-type SiC substrate.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 illustrates an N-channel Silicon Carbide (SiC) Insulated Gate Bipolar Transistor (IGBT);

FIGS. 2A through 2E graphically illustrate a state-of-the-art process for fabricating the N-channel SiC IGBT of FIG. 1;

Figure 3:
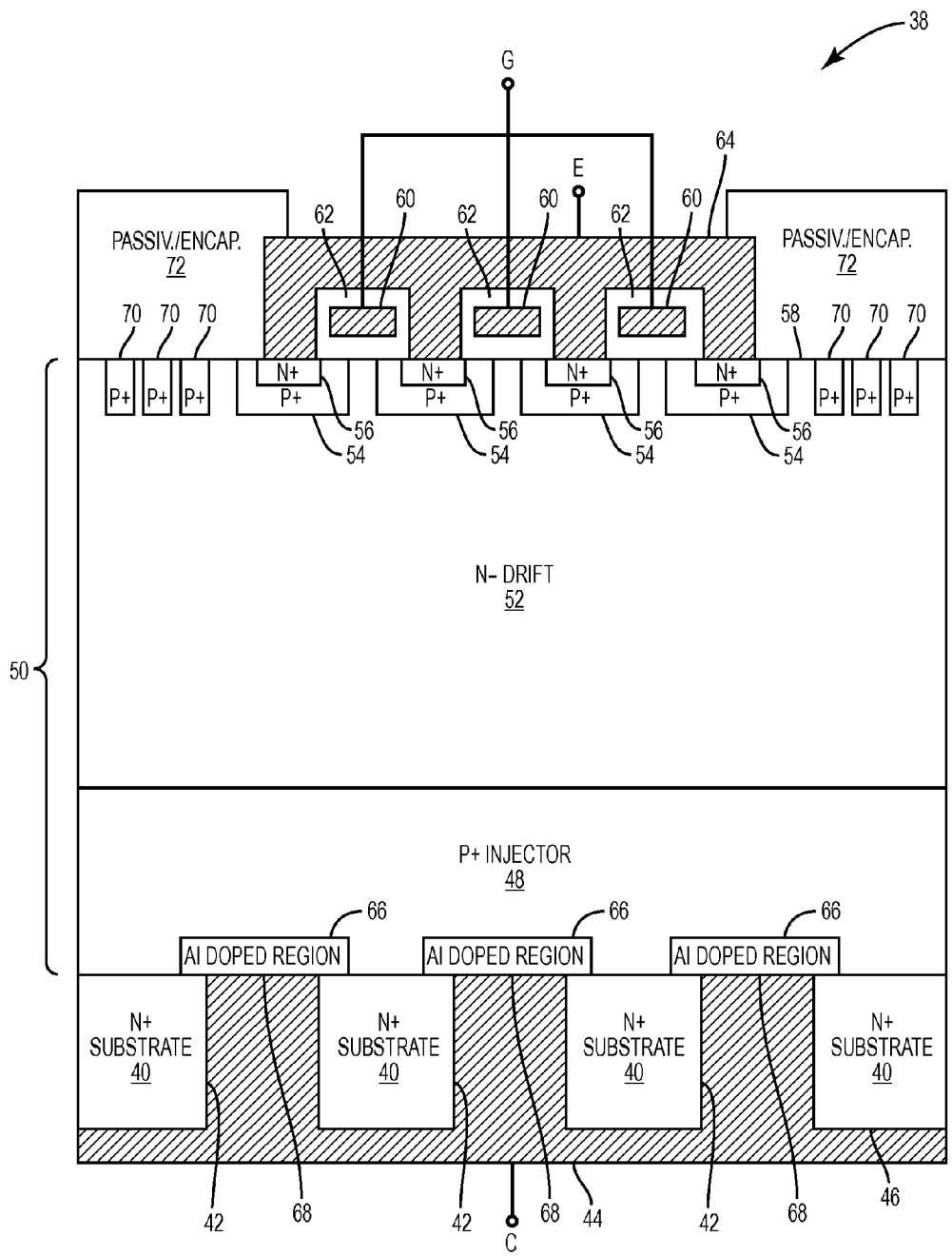
FIG. 3 illustrates an N-channel SiC IGBT having an N-type SiC substrate, a P-type SiC injector layer, and openings formed through the N-type SiC substrate to the P-type SiC injector layer that enable a collector contact on a back-side of the N-type SiC substrate to physically and electrically contact the P-type SiC injector layer according to one embodiment of the present disclosure.
Figure 6:
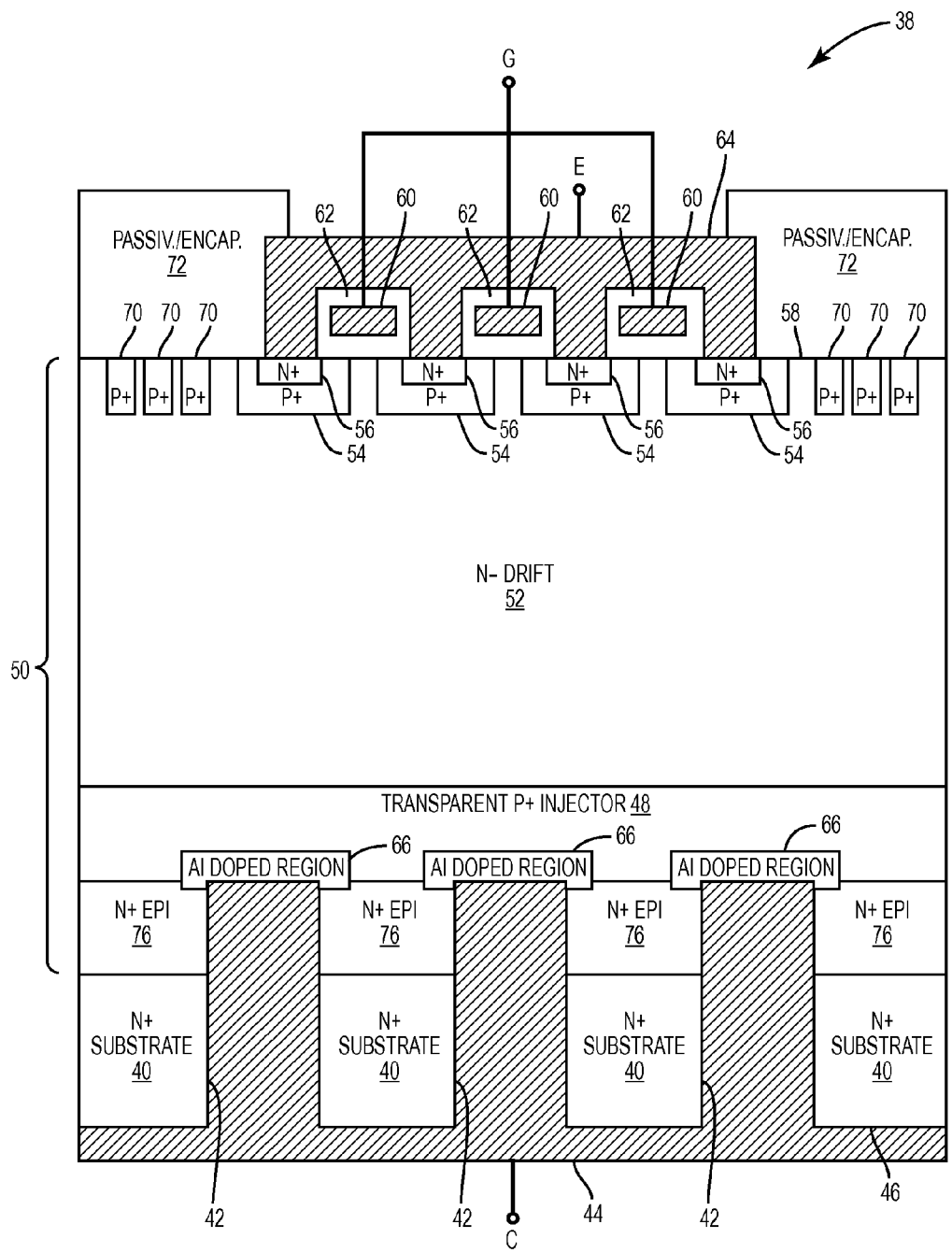
Figure 7:
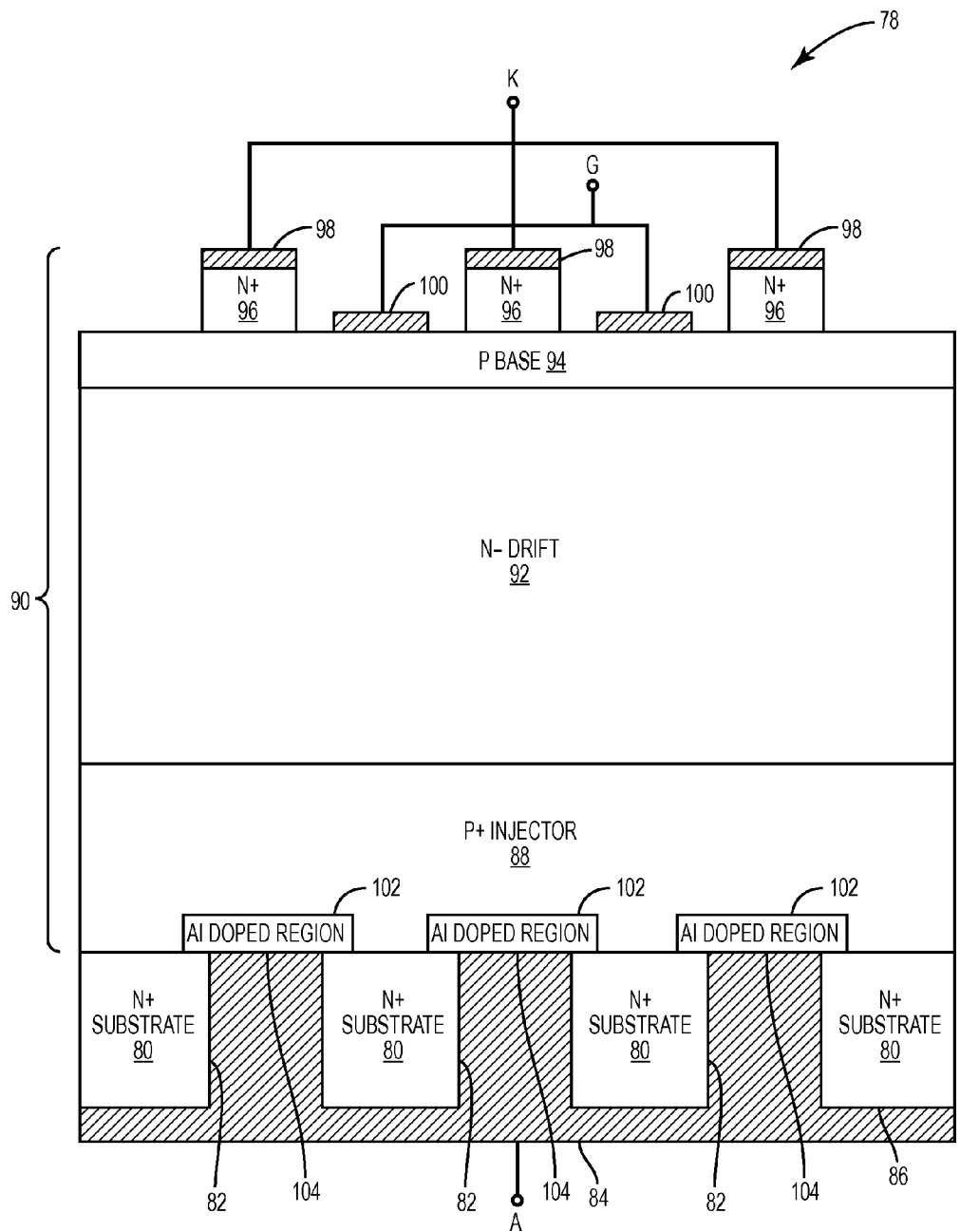
Figure 8:
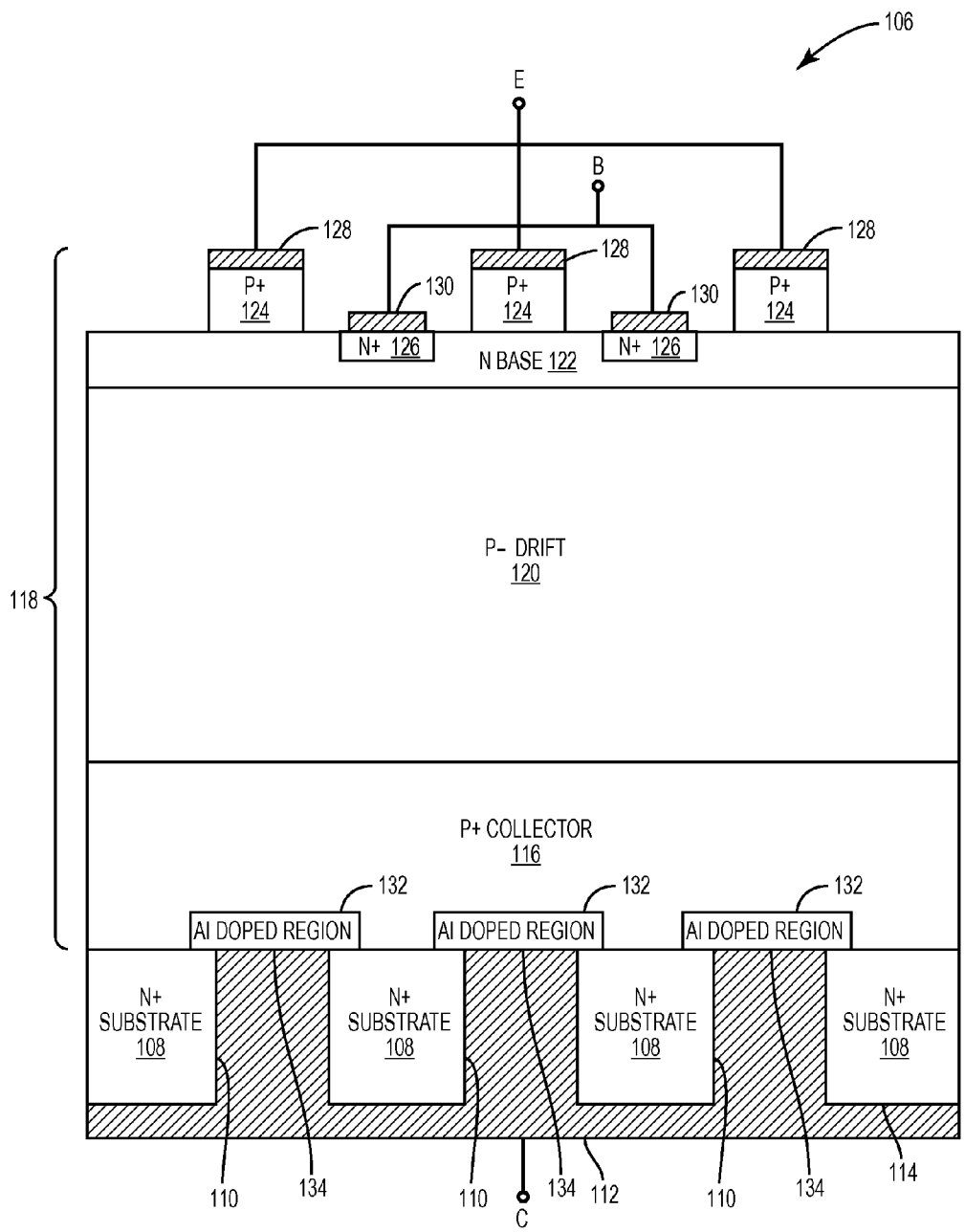
Figure 9:
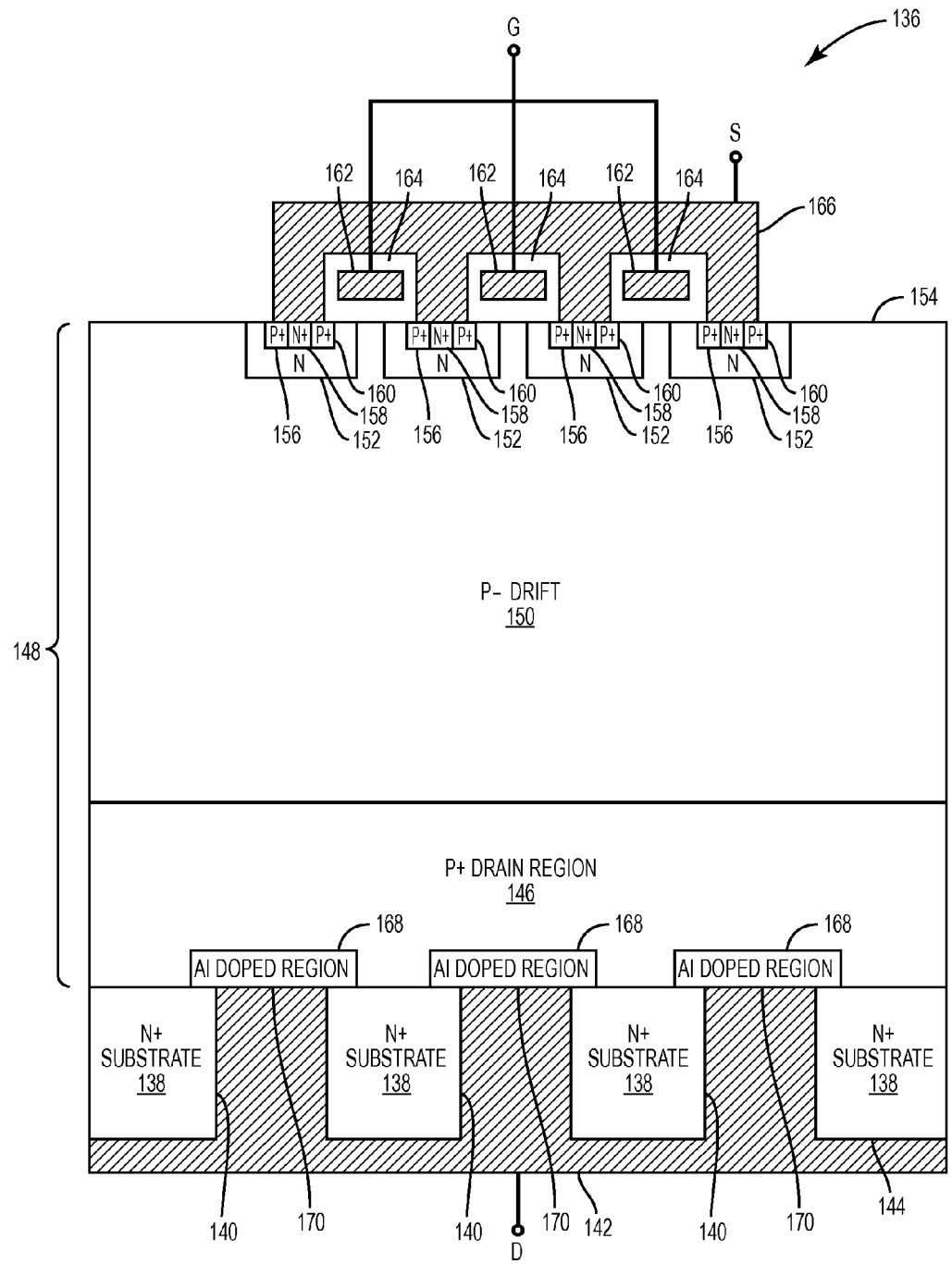

FIGS. 5A through 5H graphically illustrate a process for fabricating the N-channel SiC IGBT of FIG. 3 according to one embodiment of the present disclosure;

FIG. 6 illustrates an N-channel SiC IGBT according to another embodiment of the present disclosure in which the P-type SiC injector layer is electrically transparent;

FIG. 7 illustrates an N-channel Gate Turn-Off thyristor (GTO) according to one embodiment of the present disclosure;

FIG. 8 illustrates a PNP Bipolar Junction Transistor (BJT) according to one embodiment of the present disclosure; and FIG. 9 illustrates a P-channel Metal Oxide Semiconductor Field Effect Transistor (MOSFET) according to one embodiment of the present disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

One issue that arises for some Silicon Carbide (SiC) power devices, such as an SiC N-channel Insulated Gate Bipolar Transistor (IGBT) or an N-channel Gate Turn-Off thyristor (GTO), is that the back-side contact needs to be connected to a P-type region, where the P-type region needs to be heavily doped (i.e., doped >$10^{18}$ dopants per cubic centimeter ($cm^3$)) so that the P-type region can act as an efficient injector of holes during forward conduction while providing minimal resistance. A natural way to fabricate these SiC power devices would be to use a P-type substrate and then grow the needed epitaxial structure on top of the P-type substrate. However, high quality P-type SiC substrates are difficult, and thus costly, to produce. In addition, holes have a very low mobility in SiC, which makes P-type SiC substrates very resistive. Fabricating power devices on a P-type SiC substrate would therefore introduce a large parasitic resistance, resulting in low efficiency. As such, there is a need for SiC power devices having back-side contacts to a P-type region that avoid the need for costly and highly resistive P-type SiC substrates, and methods of fabrication thereof.

Embodiments of a Silicon Carbide (SiC) semiconductor device having back-side contacts to a P-type region and methods of fabrication thereof are disclosed. In one embodiment, an SiC semiconductor device includes an N-type SiC substrate and an epitaxial structure on a front-side of the SiC substrate. The epitaxial substrate includes a P-type SiC layer adjacent to the N-type SiC substrate and one or more additional SiC layers on the P-type SiC layer opposite the N-type SiC substrate. The semiconductor device also includes one or more openings through the N-type SiC substrate that extend from a back-side of the N-type SiC substrate to the P-type SiC layer and a back-side contact on the back-side of the N-type substrate and within the one or more openings such that the back-side contact is in physical and electrical contact with the P-type SiC layer. The semiconductor device further includes front-side contacts on the epitaxial structure opposite the N-type SiC substrate. By using the N-type SiC substrate and the opening(s) through the N-type SiC substrate for the contact to the P-type SiC layer, the need for a P-type SiC substrate is avoided, which in turn reduces the cost and complexity of fabricating the semiconductor device.

Figure 1:
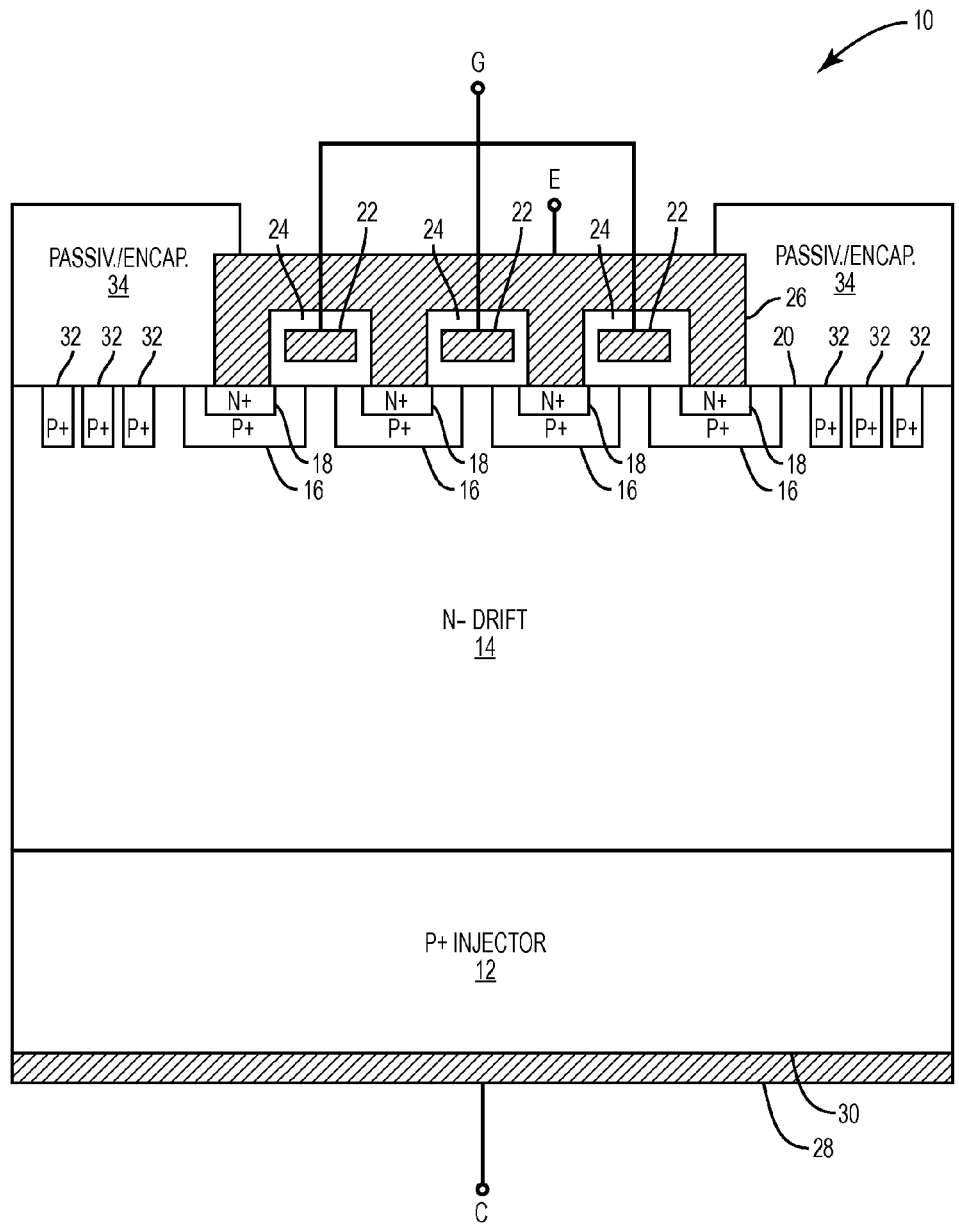

Before discussing various embodiments of the disclosed semiconductor device and methods of fabrication thereof, a discussion of the state of the art and the problems associated therewith is beneficial. In this regard, FIG. 1 illustrates an N-channel SiC IGBT 10. As illustrated, the IGBT 10 includes a highly doped P-type (P+) injector layer 12 and a lightly doped N-type (N−) drift layer 14 on the P+ injector layer 12. Both the P+ injector layer 12 and the N− drift layer 14 are formed on SiC. P+ wells 16 and highly doped N-type (N+) emitter regions 18 are formed in a front-side 20 of the N− drift layer 14, where the front-side 20 of the N− drift layer 14 is also referred to herein as a front-side of a semiconductor wafer formed by the P+ injector layer 12 and the N− drift layer 14. In addition, gate contacts 22, which are insulated by an insulating material 24, and an emitter contact 26 are formed on the front-side 20 of the N− drift layer 14. A collector contact 28 is formed on a back-side 30 of the P+ injector layer 12, which is also referred to herein as a back-side of the semiconductor wafer. During a forward conducting state of the IGBT 10, electrons flow from the emitter contact 26 through the N+ emitter regions 18 and a channel created through the P+ wells 16 and into the N− drift layer 14. From the N− drift layer 14, the electrons flow through the P+ injector layer 12 to the collector contact 28. In addition, because the IGBT 10 is a bipolar device, during the forward conduction state, minority carriers (which in this case are holes) are injected into the N− drift layer 14 from the P+ injector layer 12, which in turn decreases an on-resistance of the IGBT 10.

In this example, the IGBT 10 also includes guard rings 32 formed around a periphery of an active area of the IGBT 10. The guard rings 32 form an edge termination for the IGBT 10. In addition, a passivation and/or encapsulation material 34 is formed over the front-side of the wafer.

Figure 2A:
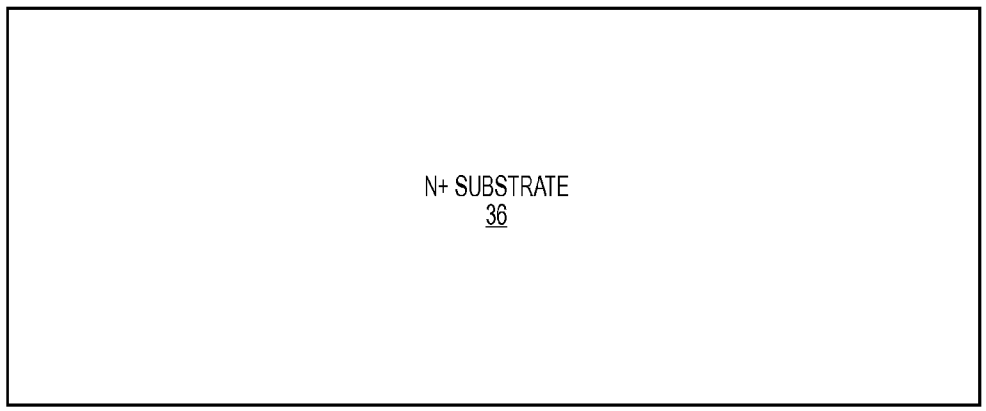
Figure 2B:
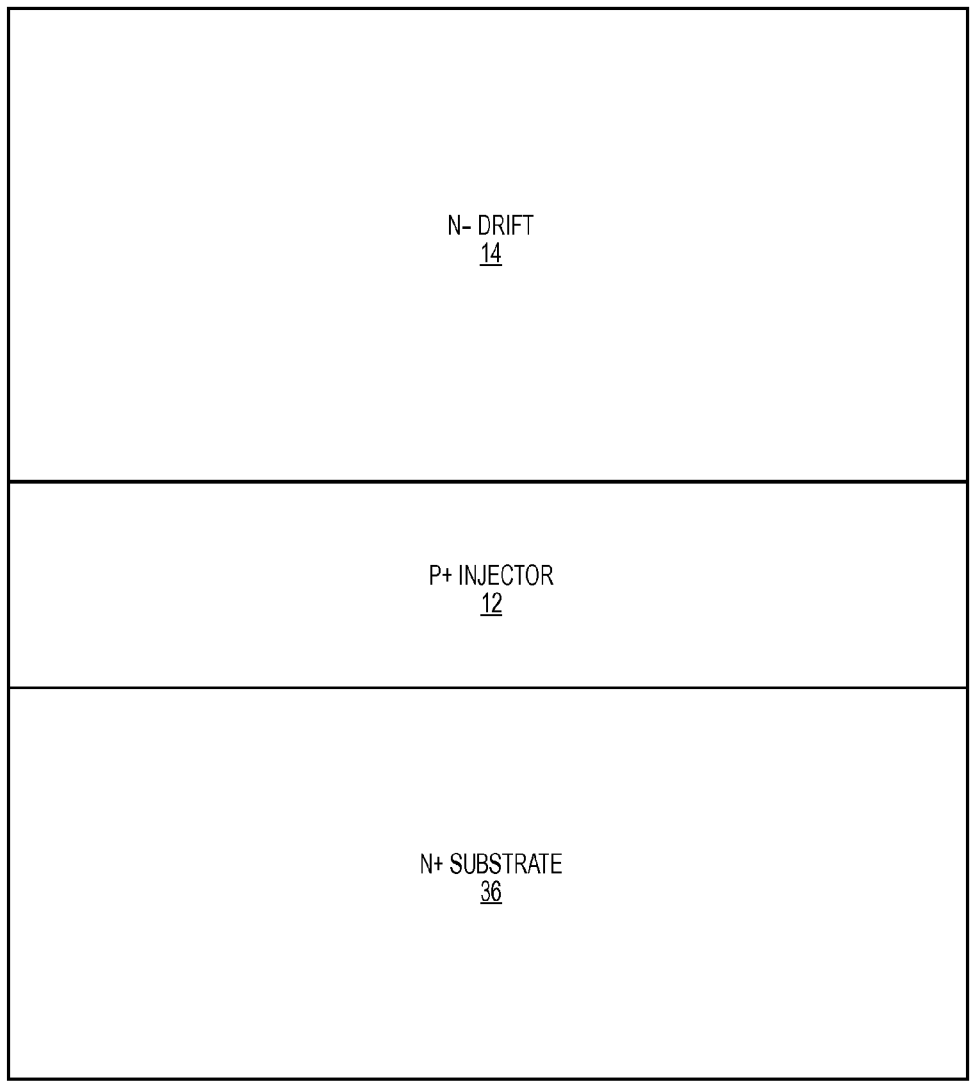
Figure 2C:
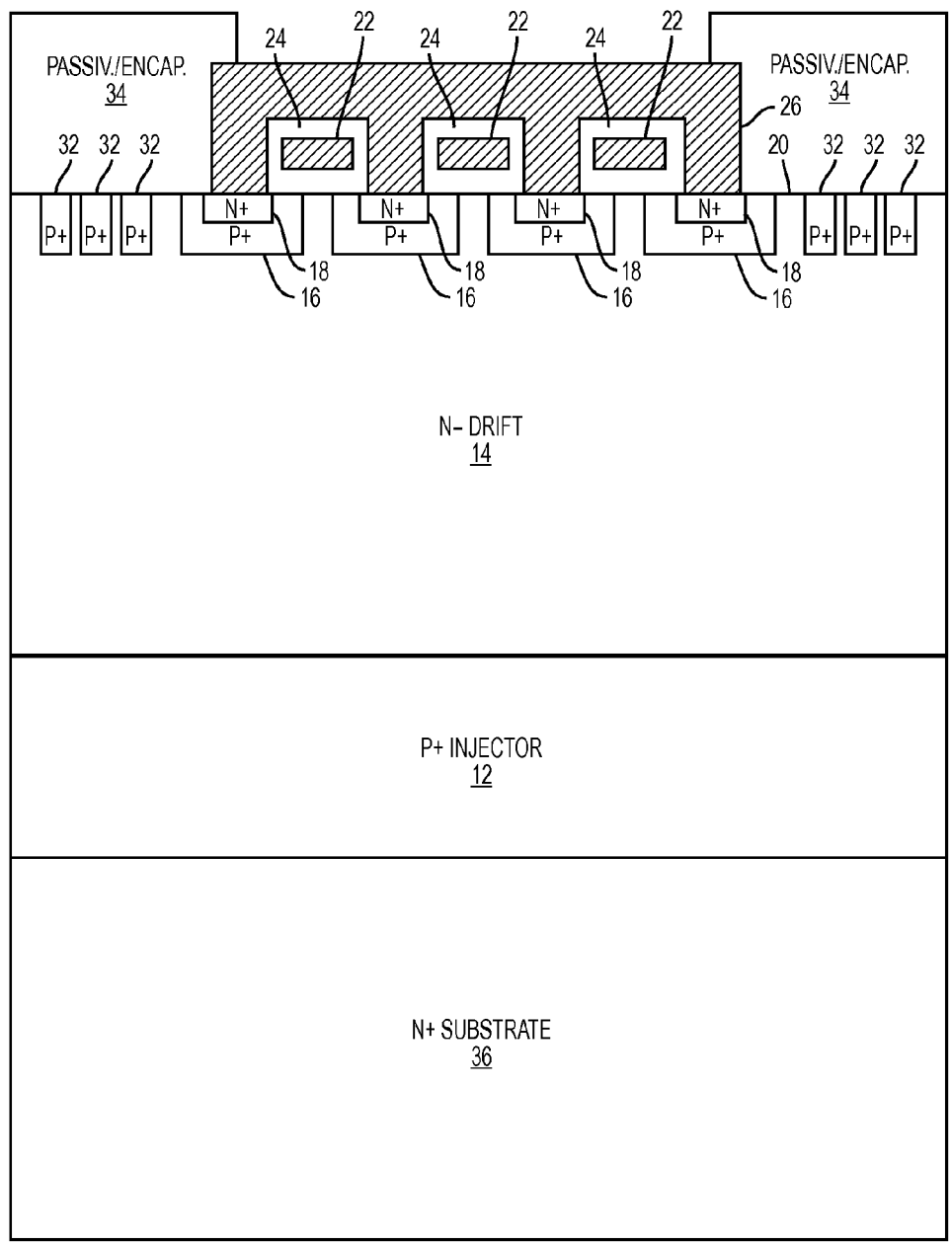
Figure 2D:
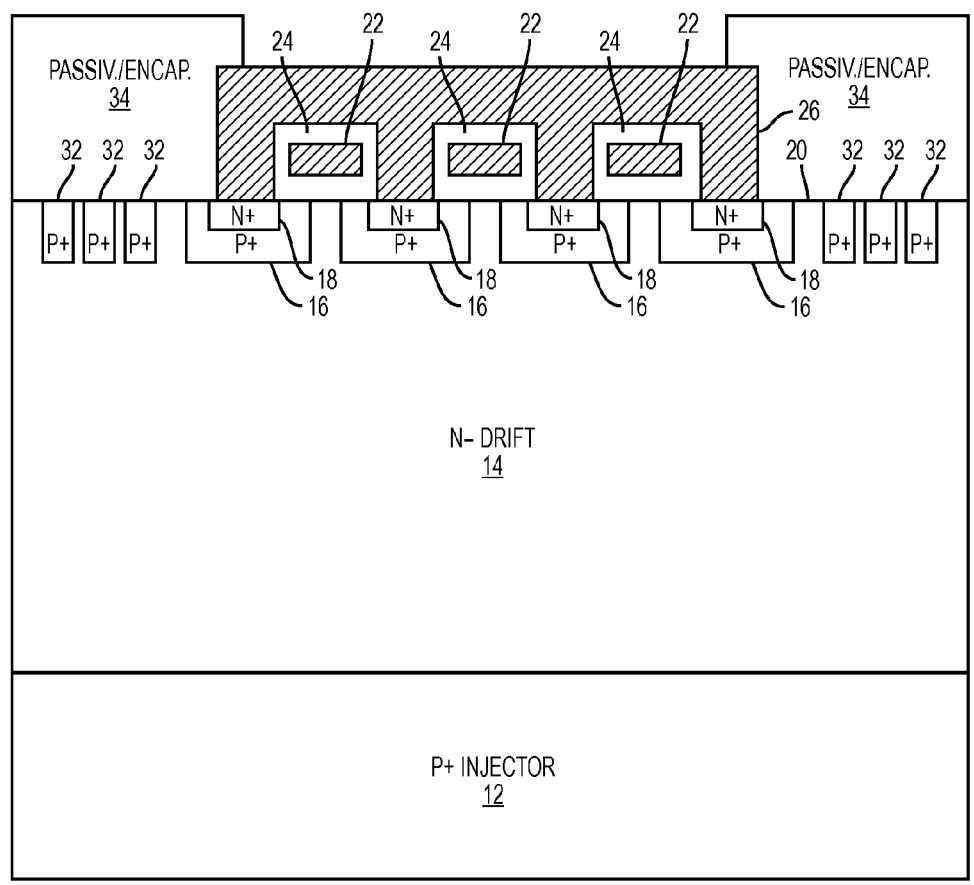
Figure 2E:
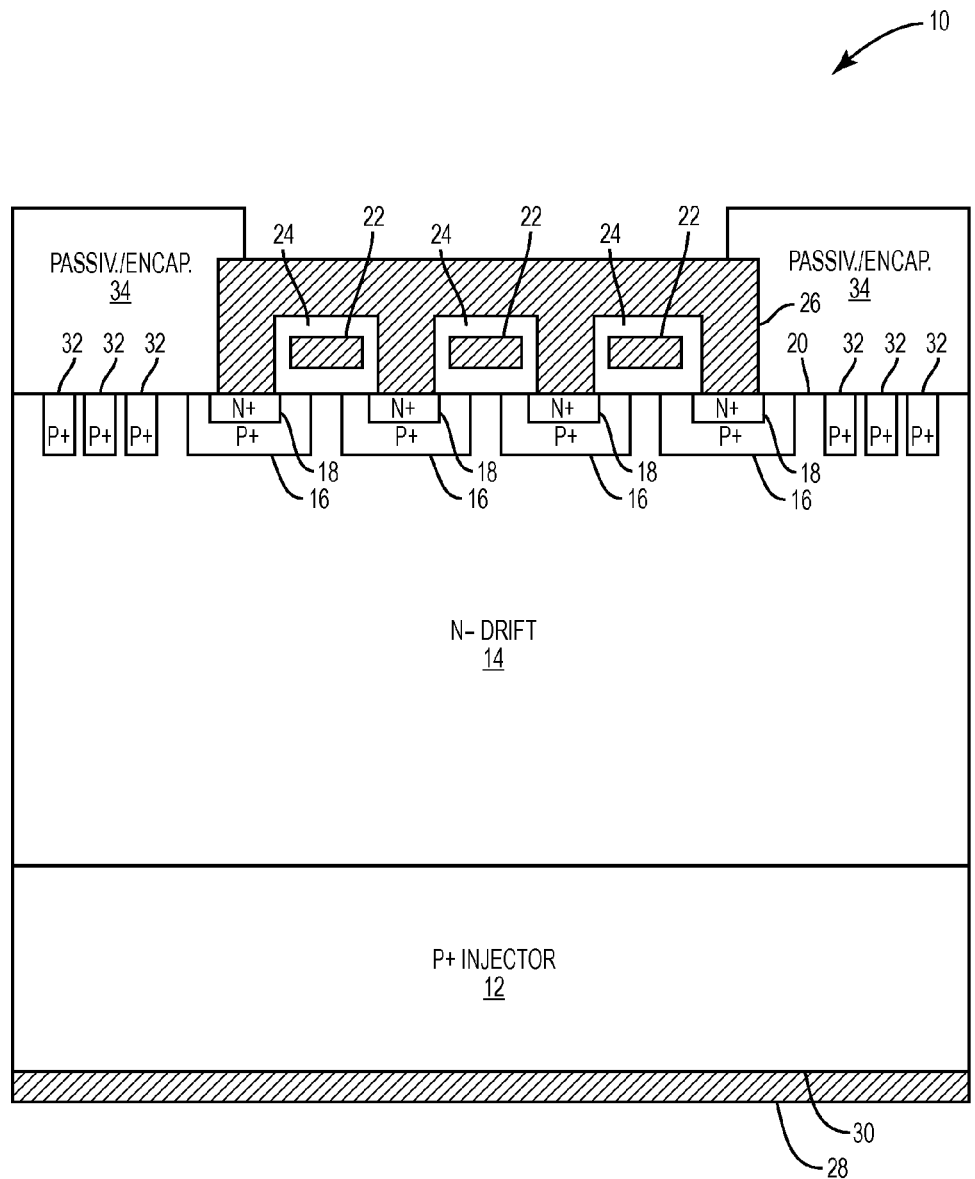

One natural way of fabricating the IGBT 10 of FIG. 1 would be to use a P+ SiC substrate as the P+ injector layer 12 and to then grow the N− drift layer 14 on the P+ injector layer 12. However, a high quality P+ SiC substrate is difficult, and thus costly, to produce. As such, one state-of-the-art process for fabricating the IGBT 10 of FIG. 1 is to epitaxially grow the P+ injector layer 12 and the N− drift layer 14 on an N+ SiC substrate, which is much less difficult and costly to produce, and then remove the N+ SiC substrate by grinding away the N+ SiC substrate. This process is illustrated in FIGS. 2A through 2E. Specifically, the process begins with an N+ SiC substrate 36 as illustrated in FIG. 2A. Next, the P+ injector layer 12 and the N− drift layer 14 are grown on the N+ SiC substrate 36 as illustrated in FIG. 2B. As illustrated in FIG. 2C, front-side processing is then performed to form the P+ wells 16, the N+ emitter regions 18, the gate contacts 22 insulated by the insulating material 24, the emitter contact 26, the guard rings 32, and the passivation and/or encapsulation material 34. Then, after front-side processing is complete, the N+ SiC substrate 36 is removed by grinding away the N+ SiC substrate 36 as illustrated in FIG. 2D. Lastly, the collector contact 28 is formed on the back-side 30 of the P+ injector layer 12 exposed after grinding away the N+ SiC substrate 36 as illustrated in FIG. 2E.

The process of FIGS. 2A through 2E has several issues. First, the precision of the grinding is difficult to control. More specifically, it is difficult to stop the grinding at the precise moment that the N+ SiC substrate 36 is removed before grinding away some if not all of the P+ injector layer 12. In addition, removal of the N+ SiC substrate 36 results in a thin wafer that is difficult to handle during processing. Therefore, the only processing step that is performed after the N+ SiC substrate 36 is removed is the formation of the collector contact 28 on the back-side 30 of the P+ injector layer 12. Note that the front-side processing needs to be performed before removing the N+ SiC substrate 36 in order to, among other things, prevent warping or bowing of the wafer during front-side processing due to the thinness of the wafer. Since front-side processing has been completed by the time of removing the N+ SiC substrate 36, a thermal budget for the formation of the collector contact 28 is very limited because high temperature processes can damage the gate and/or emitter contacts 22 and 26 as well as the insulating material 24 and/or the passivation/encapsulation material 34 on the front-side of the wafer. Processing steps on the back-side of the wafer such as activation of ion implants, optimal annealing of ohmic contacts, and the like cannot be performed due to this limited thermal budget.

Further, Aluminum (Al) doping in the range of $10^{19}$ to $10^{21}$ dopants per $cm^3$ is desired for a low resistance ohmic contact to the P-type injector layer 12. Due to the limited thermal budget, in the state-of-the-art process, Al doping is performed using epitaxial growth (i.e., the P-type injector layer 12 is either Al doped or contains an Al doped sub-layer adjacent to the back-side of the wafer). However, heavy Al doping in this manner above $10^{19}$ dopants per $cm^3$ increases a defect density during epitaxial growth. These defects propagate to the N– drift layer 14 as recombination centers. This leads to inferior carrier lifetime and degradation of the bipolar operation of the IGBT 10 when the IGBT 10 is forward biased.

Still further, in the state-of-the-art process, the collector contact 28 is formed on the back-side 30 of the P+ injector layer 12 by laser annealing in order to avoid high temperature processing after removing the N+ SiC substrate 36. The local temperature at the back-side of the wafer during laser annealing of the collector contact 28 can exceed 1300° C. This temperature is much greater than a known optimal temperature range for forming ohmic contacts to P-type SiC, which is 850-900° C.

FIG. 3 illustrates an N-channel SiC IGBT 38 according to one embodiment of the present disclosure. In general, the N-channel SiC IGBT 38 is grown on an N+ substrate 40. Unlike the IGBT 10 fabricated according to the process of FIGS. 2A through 2E, the N+ substrate 40 is not removed. Rather, openings 42 are formed through the N+ substrate 40, and a collector contact 44 is formed on a back-side 46 of the N+ substrate 40 and within the openings 42 such that the collector contact 44 is in physical and electrical contact with a P+ injector layer 48 of the IGBT 38. Since the N+ substrate 40 is not removed, the wafer can remain sufficiently thick to be easily handled during fabrication and have a higher mechanical stability. As a result, higher processing and packaging yields can be achieved. In addition, by not removing the N+ substrate 40 and by forming the openings 42 through the N+ substrate 40, various back-side processing steps (e.g., ion implantation and annealing) that could not be performed when using the state-of-the-art process of FIGS. 2A through 2E can now be performed.

More specifically, as illustrated in FIG. 3, the IGBT 38 includes the N+ substrate 40 and an epitaxial structure 50 grown on the N+ substrate 40. Both the N+ substrate 40 and the epitaxial structure 50 are formed of SiC. The epitaxial structure 50 includes the P+ injector layer 48 on, and preferably directly on, the N+ substrate 40 and an N– drift layer 52 on, and preferably directly on, the P+ injector layer 48 opposite the N+ substrate 40. P+ wells 54 and N+ emitter regions 56 within the P+ wells 54 are formed in a front-side 58 of the N– drift layer 52, where the front-side 58 of the N– drift layer 52 is also referred to herein as a front-side of a semiconductor wafer formed by the N+ substrate 40 and the epitaxial structure 50. In addition, gate contacts 60, which are insulated by an insulating material 62, and an emitter contact 64 are formed on the front-side 58 of the N– drift layer 52. The collector contact 44 is formed on the back-side 46 of the N+ substrate 40, which is also referred to herein as a back-side of the semiconductor wafer, and within the openings 42 through the N+ substrate 40. The openings 42 extend from the back-side 46 of the N+ substrate 40 to, and potentially into, the P+ injector layer 48. The gate contacts 60, the emitter contact 64, and the collector contact 44 are formed of any suitable metal(s) and/or metal alloy(s).

Al doped regions 66 are formed at a back-side of the P+ injector layer 48. Notably, as compared to the IGBT 10 of FIG. 1 where ion implantation on the back-side of the wafer is not permissible due the very limited thermal budget after removing the N+ SiC substrate 36, the Al doped regions 66 can be formed via ion implantation through the openings 42 before performing any front-side processing steps that limit the thermal budget to a point that prohibits ion implantation and thermal annealing (e.g., before forming any of the gate contacts 60, the insulating material 62, and the emitter contact 64). This is possible due to the ease of handling the wafer and the improved mechanical stability of the wafer provided by the N+ substrate 40.

The Al doped regions 66 are aligned with the openings 42 and extend from within the P+ injector layer 48 to terminating ends 68 of the corresponding openings 42. The Al doped regions 66 are highly doped. In one preferred embodiment, a doping concentration of the Al doped regions 66 is greater than about $10^{19}$ dopants per $cm^3$ and more preferably in a range of and including about $10^{19}$-$10^{20}$ dopants per $cm^3$, whereas a doping concentration of the P+ injector layer 48 can be less than $10^{19}$ dopants per $cm^3$ or more preferably approximately $10^{18}$ dopants per $cm^3$ (e.g., $5 \times 10^{17}$ to $5 \times 10^{18}$ dopants per $cm^3$). Along with thermal annealing (e.g., Rapid Thermal Annealing) of the collector contact 44 in an optimal temperature range of 800-900° C., the Al doped regions 66 provide a good ohmic contact between the collector contact 44 and the P+ injector layer 48. Further, by providing the high Al doping concentration in the Al doped regions 66 via ion implantation rather than providing high Al doping via epitaxial growth as done in the IGBT 10, a low defect density in the P+ injector layer 48 is achieved. Note that while the Al doped regions 66 are doped with Al in this embodiment, other dopants may additionally or alternatively be used. Further, while the Al doped regions 66 are illustrated and described herein, as one alternative embodiment, the Al doped regions 66 may be replaced with a highly doped epitaxial layer between the N+ substrate 40 and the P+ injector layer 48.

In this example, the IGBT 38 also includes guard rings 70 formed around a periphery of an active area of the IGBT 38. The active area of the IGBT 38 is an area of the wafer in which current flows in the forward conduction state, which corresponds to the area of the wafer below the P+ wells 54. The guard rings 70 form an edge termination for the IGBT 38. In addition, a passivation and/or encapsulation material 72 is formed over the front-side of the wafer.

Figure 4C:
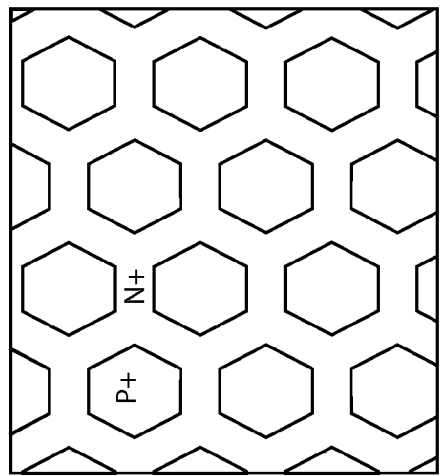
FIGS. 4A through 4C illustrate some exemplary patterns for the openings through the N-type SiC substrate of the IGBT of FIG. 3 according to one embodiment of the present disclosure.
Figure 4B:
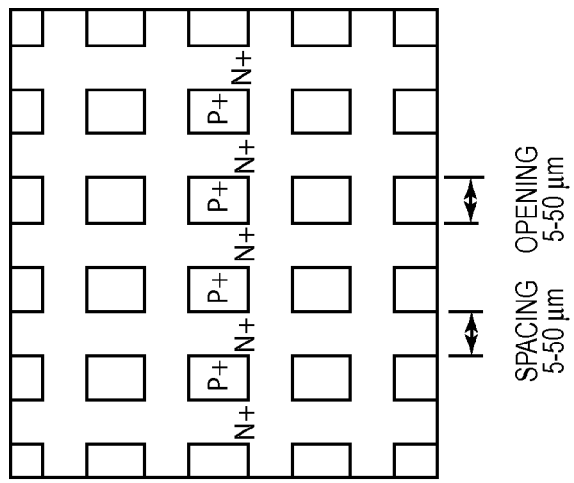
Figure 4A:
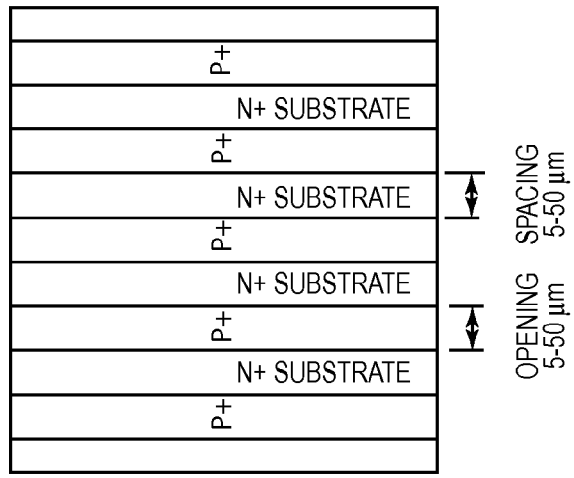

FIGS. 4A through 4C illustrate some exemplary patterns for the openings 42 through the N+ substrate 40. Note that these are just examples. The openings 42 may have any desired density, any desired size, and/or any desired shape and can be arranged randomly or in any desired pattern. In these embodiments, a minimum size of the openings 42 is in range of and including about 5-50 microns (μm), and a minimum spacing between the openings 42 is in a range of and including about 5-50 μm. It should be noted that while in the examples of FIGS. 4A through 4C there are many openings 42, there may be any number of one or more openings 42 through the N+ substrate 40. Further, in one embodiment, the one or more openings 42 expose greater than or equal to 40% but less than 100% of the back-side of the P+ injector layer 48. In one embodiment, the one or more openings 42 expose between about 40-90% of the back-side of the P+ injector layer 48. In one embodiment, the one or more openings 42 expose between about 40-80% of the back-side of the P+ injector layer 48. In one embodiment, the one or more openings 42 expose between about 40-70% of the back-side of the P+ injector layer 48. In one embodiment, the one or more openings 42 expose between about 40-60% of the back-side of the P+ injector layer 48. In one embodiment, the one or more openings 42 expose between about 40-50% of the back-side of the P+ injector layer 48. In another embodiment, the one or more openings 42 expose greater than or equal to 50% and up to and including 100% of the back-side of the P+ injector layer 48 within the active area of device(s) fabricated on the wafer. In one embodiment, the one or more openings 42 expose greater than or equal to 60% and up to and including 100% of the back-side of the P+ injector layer 48 within the active area of the wafer. In another embodiment, the one or more openings 42 expose greater than or equal to 70% and up to and including 100% of the back-side of the P+ injector layer 48 within the active area of the wafer. In yet another embodiment, the one or more openings 42 expose greater than or equal to 80% and up to and including 100% of the back-side of the P+ injector layer 48 within the active area of the wafer. In yet another embodiment, the one or more openings 42 expose greater than or equal to 90% and up to and including 100% of the back-side of the P+ injector layer 48 within the active area of the wafer.

Figure 5A:
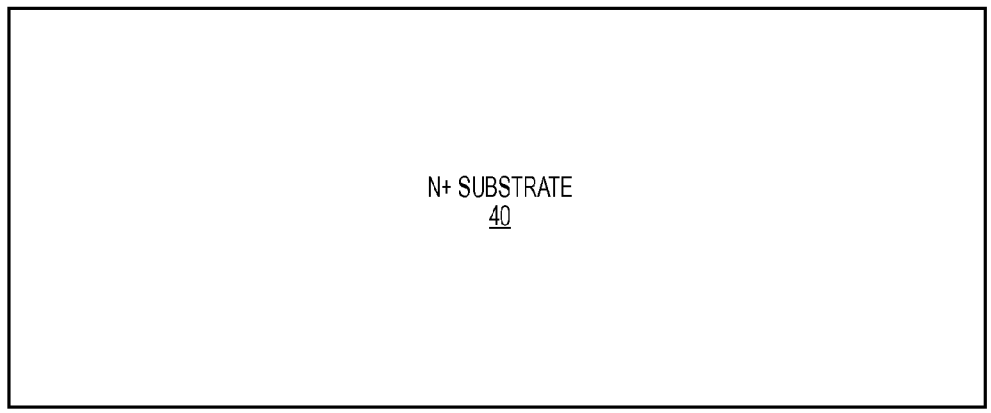
Figure 5B:
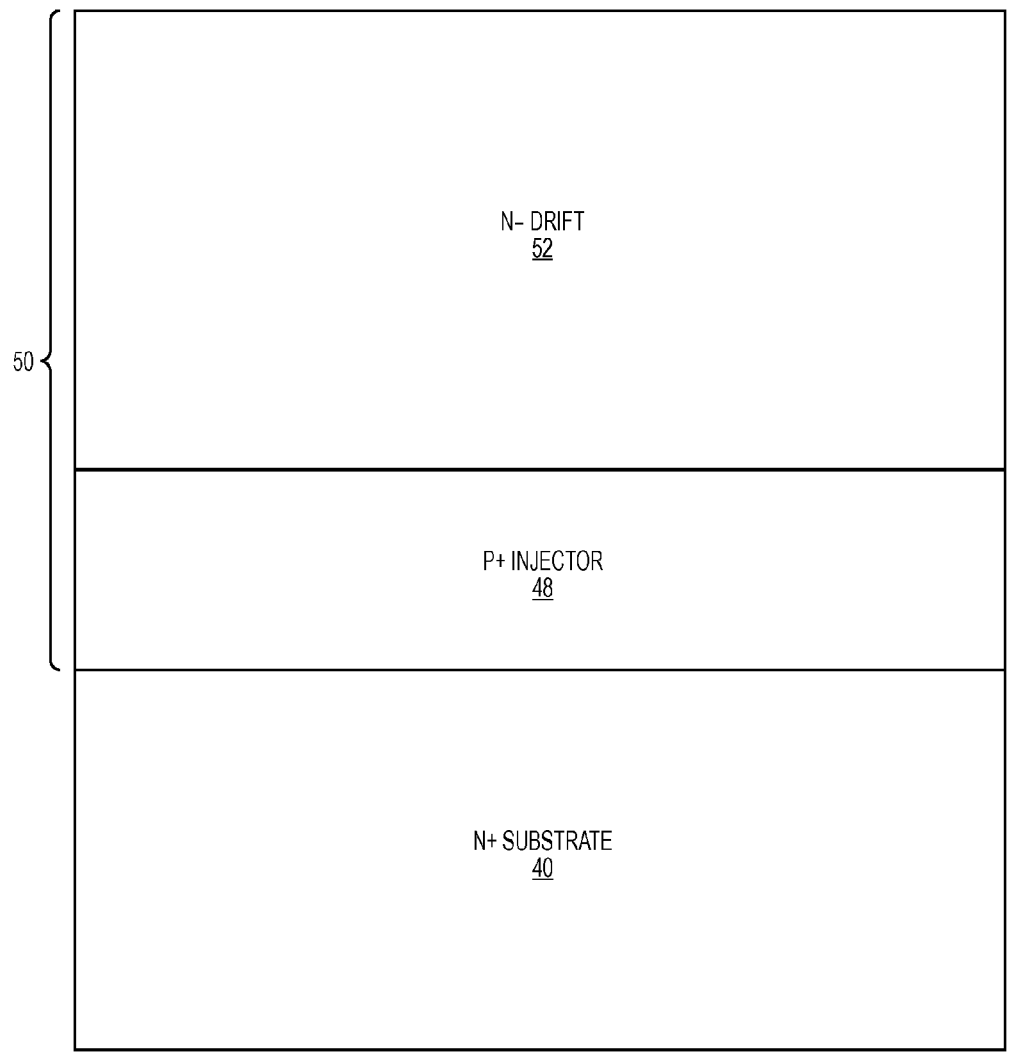
Figure 5C:
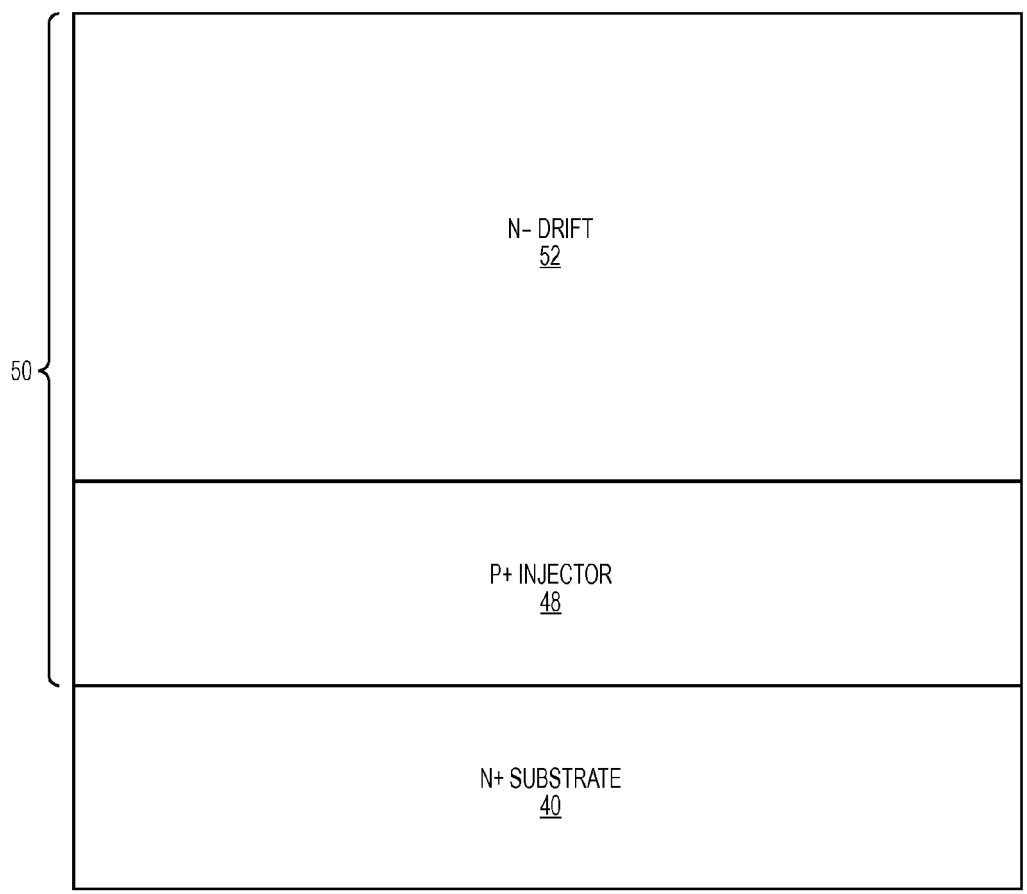

FIGS. 5A through 5E illustrate a process for fabricating the IGBT 38 of FIG. 3 according to one embodiment of the present disclosure. As illustrated in FIG. 5A, the process begins with the N+ substrate 40, which is an N+ SiC substrate. Next, the epitaxial structure 50 is grown on the N+ substrate 40 as illustrated in FIG. 5B. Specifically, the P+ injector layer 48 is grown on the N+ substrate 40, and the N− drift layer 52 is grown on the P+ injector layer 48 opposite the N+ substrate 40. Again, both the P+ injector layer 48 and the N− drift layer 52 are formed of SiC. Next, in this embodiment, the N+ substrate 40 is thinned to a desired thickness as illustrated in FIG. 5C. Note that this step is optional. The N+ substrate 40 is thinned using any suitable process such as, but not limited to, grinding the back-side 46 of the N+ substrate 40 until the N+ substrate 40 reaches the desired thickness. The desired thickness of the N+ substrate 40 after thinning may vary depending on the particular implementation. However, in general, the desired thickness of the N+ substrate 40 after thinning is a tradeoff between mechanical stability of the wafer and electrical performance of the IGBT 38 (e.g., reducing the thickness reduces a thermal resistance of the IGBT 38 but decreases the mechanical stability of the wafer). In addition, thinning the N+ substrate 40 reduces an etch depth required to etch through the N+ substrate 40. In one particular implementation, the desired thickness of the N+ substrate 40 after thinning is in a range of and including 100 to 150 μm. Still further, in another particular implementation, the desired thickness of the N+ substrate 40 after thinning is in a range of and including 100 to 150 μm and a thickness of the epitaxial structure 50 is at least 150 μm such that a total thickness of the wafer is greater than 250 μm.

Figure 5D:
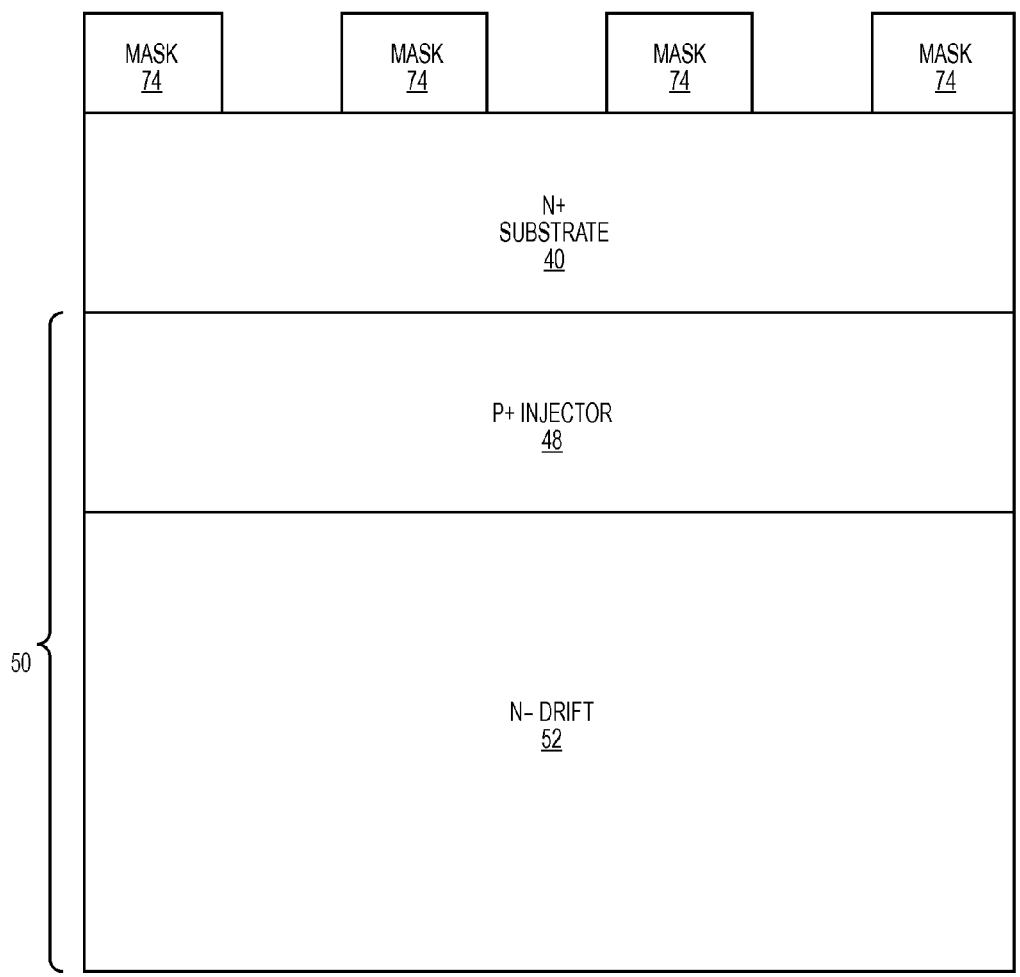
Figure 5E:
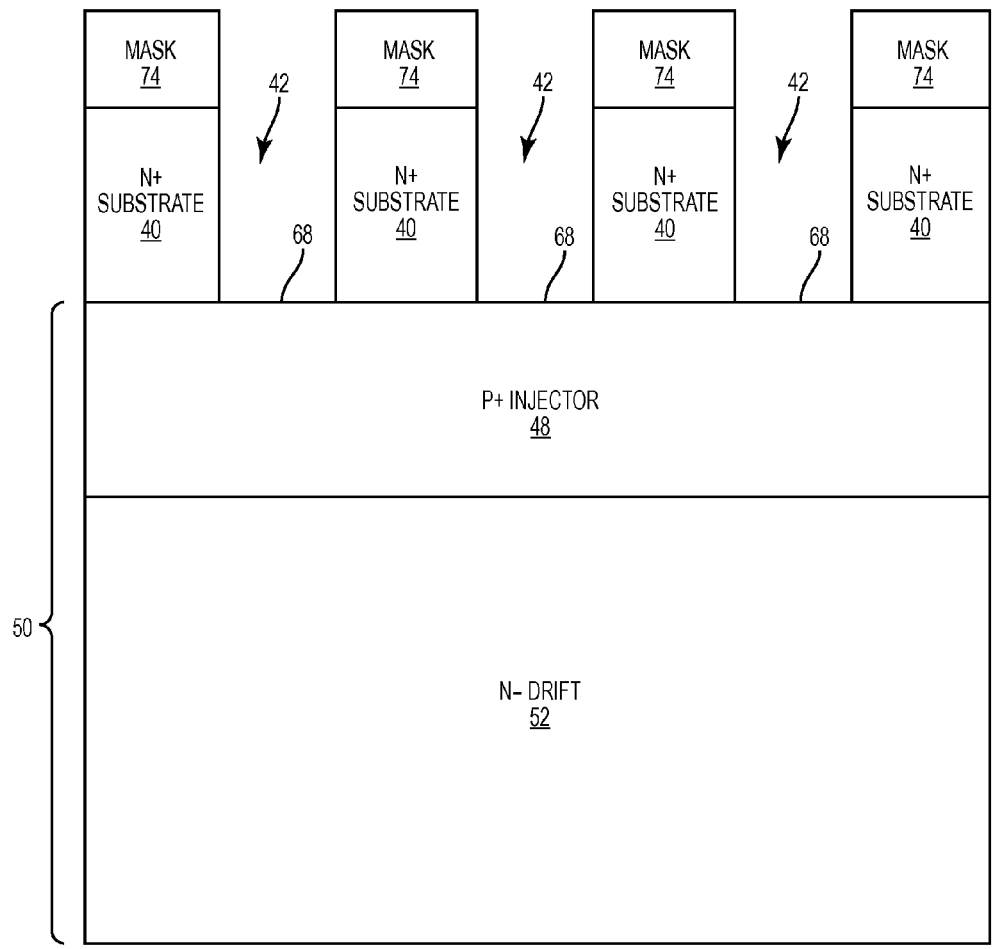
Figure 5F:
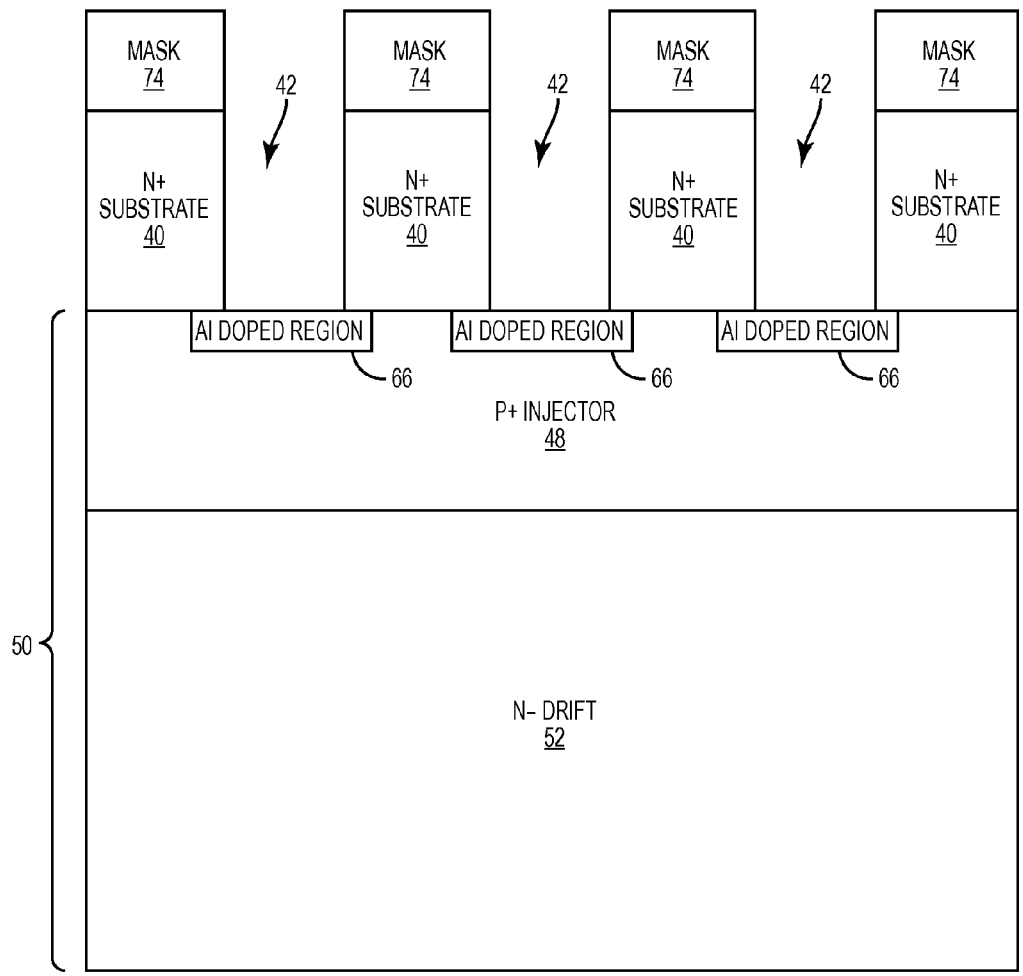

Next, the wafer is flipped and a mask 74 defining desired locations for the openings 42 through the N+ substrate 40 is formed on the back-side of the N+ substrate 40 as illustrated in FIG. 5D. Using the mask 74, the N+ substrate 40 is then etched to form the openings 42 that extend from the back-side 46 of the N+ substrate 40 to the P+ injector layer 48 as illustrated in FIG. 5E. Note that while the openings 42 are illustrated as stopping substantially immediately upon reaching the P+ injector layer 48, the openings 42 may alternatively extend into the P+ injector layer 48. After forming the openings 42, the Al doped regions 66 are formed in the P+ injector layer 48 via ion implantation into the surface of the P+ injector layer 48 at the terminating ends 68 of the openings 42 exposed by the mask 74 as illustrated in FIG. 5F.

Figure 5G:
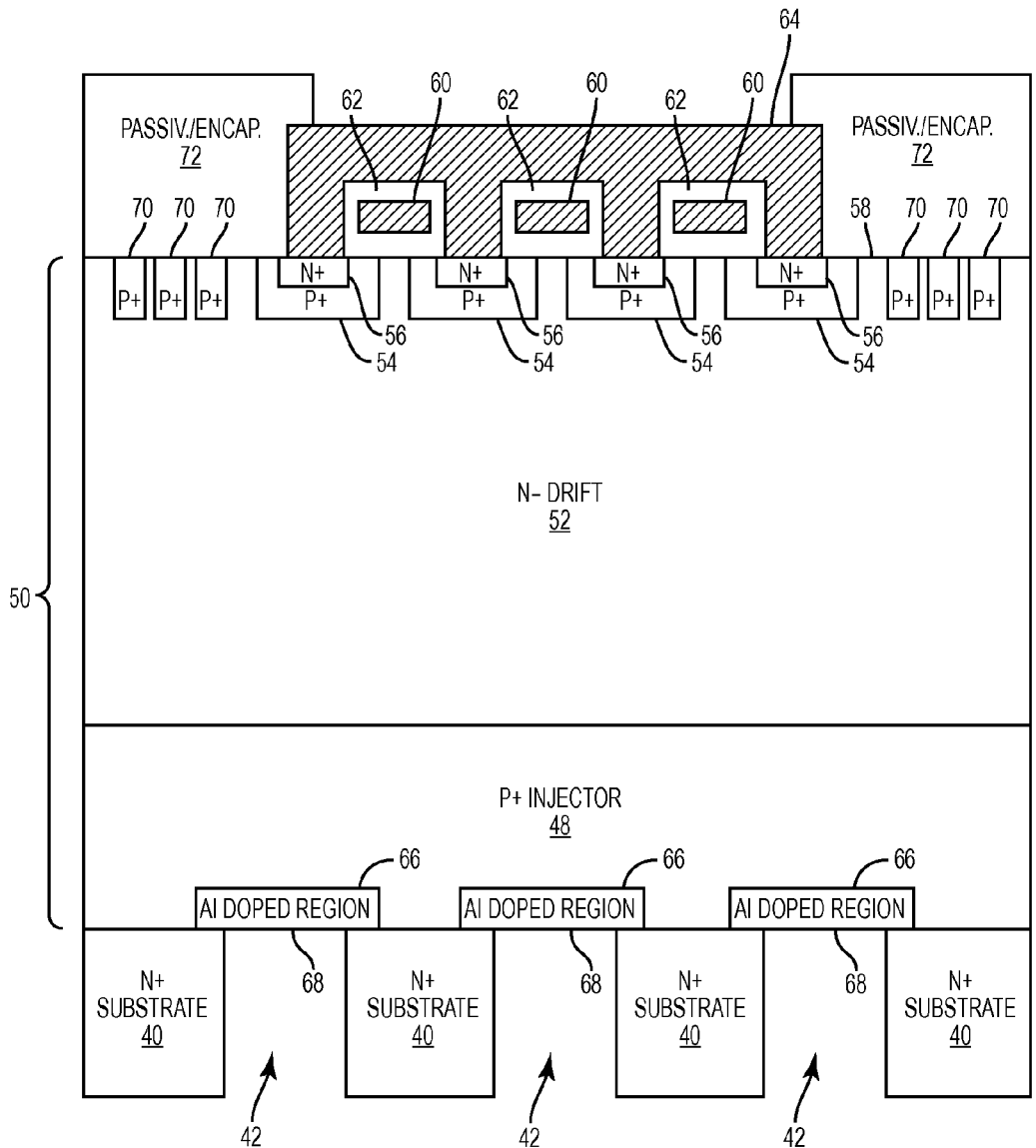
Figure 5H:
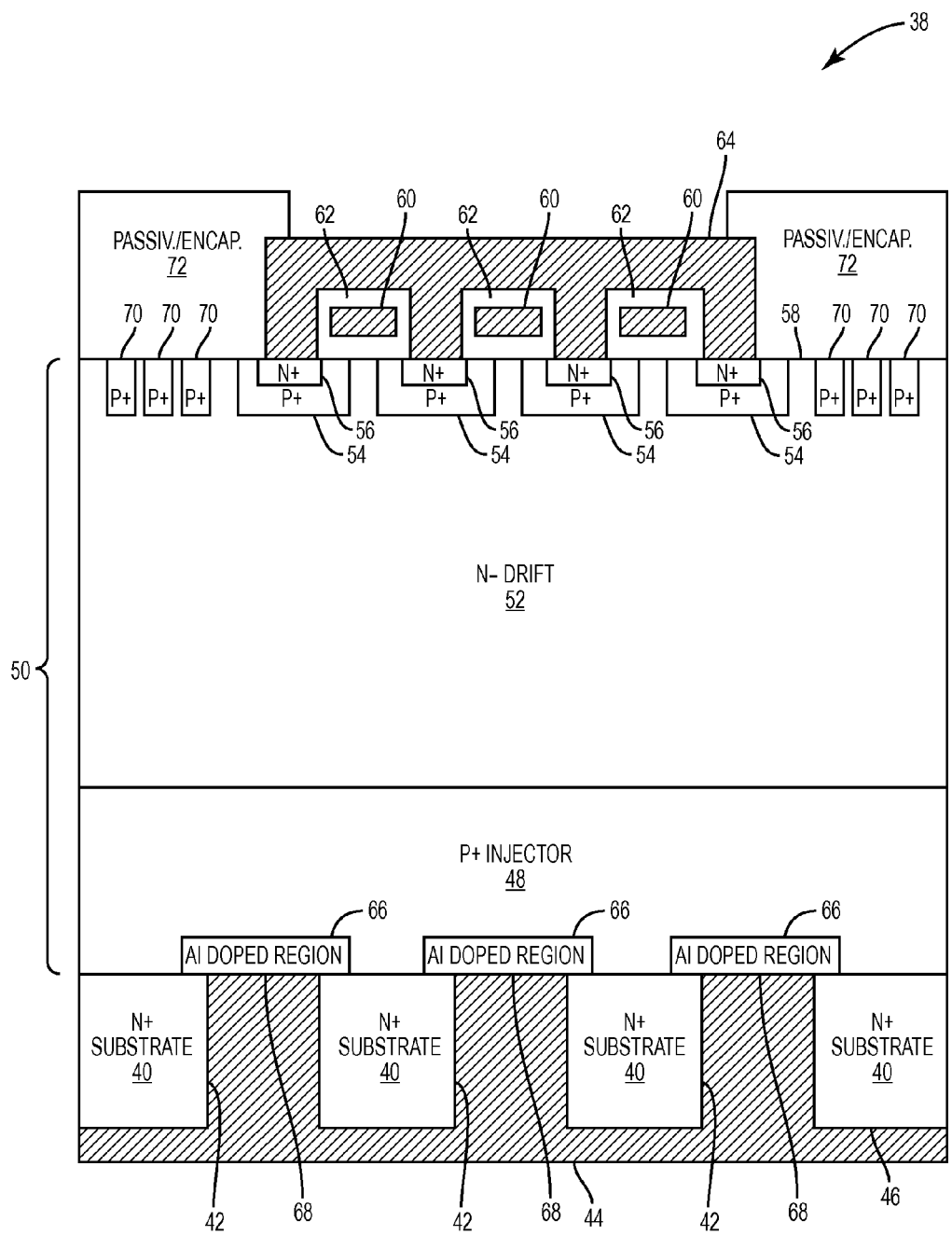

Next, the wafer is again flipped, and then front-side process is performed to form the P+ wells 54, the N+ emitter regions 56, the gate contacts 60 insulated by the insulating material 62, the emitter contact 64, and the passivation and/or encapsulating material 72, as illustrated in FIG. 5G. Notably, the implants for the Al doped regions 66 and the implants for the P+ wells 54, the N+ emitter regions 56, and the guard rings 70 may be activated at the same time via heating the wafer to a high temperature (e.g., about 1600° C.). Of course, this would be done before forming the contacts 60, 64, and 44. After activating the implants, the gate contacts 60, the emitter contact 64, and the passivation and/or encapsulation material 72 are formed on the front-side of the wafer. Lastly, the collector contact 44 is formed on the back-side 46 of the N+ substrate 40 and within the openings 42 as illustrated in FIG. 5H.

FIG. 6 illustrates the IGBT 38 according to another embodiment of the present disclosure. A switching performance of the IGBT 38, which is a bipolar device, can be improved by reducing an injection efficiency of the P+ injector layer 48. In this embodiment, the injection efficiency of the P+ injector layer 48 is reduced by reducing a thickness of the P+ injector layer 48 to the order of a diffusion length of electrons. In one embodiment, the thickness of the P+ injector layer 48 is in a range of and including 0.5 to 5 μm, and more preferably in a range of and including 1 to 3 μm, and even more preferably approximately equal to 2 μm. By reducing the thickness of the P+ injector layer 48 to the order of the diffusion length of electrons, the P+ injector layer 48 becomes "electrically transparent" to electrons that are back-injected from the N− drift layer 52. These electrons are then collected at the collector contact 44 by an additional N+ epitaxial layer 76 that is between the N+ substrate 40 and the P+ injector layer 48. In this embodiment, the openings 42 extend from the back-side 46 of the N+ substrate 40 through the N+ substrate 40 and the N+ epitaxial layer 76 to the P+ injector layer 48. In this embodiment, the injection efficiency can also be adjusted by changing a density and spacing between the openings 42. The larger the spacing between the openings 42, the lower the injection efficiency of the P+ injector layer 48.

Thus far, the discussion has focused on the IGBT 38. However, the concepts disclosed herein are applicable to other SiC semiconductor devices where a back-side contact is to be formed to a P-type layer. For instance, as discussed below, the concepts disclosed herein are applicable to other types of bipolar devices such as, for example, an N-channel GTO, an N-channel thyristor, and a PNP Bipolar Junction Transistor (BJT). In addition, the concepts disclosed herein are applicable to similar unipolar devices such as a Metal Oxide Semiconductor Field Effect Transistor (MOSFET).

In this regard, FIG. 7 illustrates an N-channel GTO 78 according to one embodiment of the present disclosure. In general, the N-channel GTO 78 is grown on an N+ substrate 80. Unlike the IGBT 10 fabricated according to the process of FIGS. 2A through 2E, the N+ substrate 80 is not removed. Rather, openings 82 are formed through the N+ substrate 80, and an anode contact 84 is formed on a back-side 86 of the N+ substrate 80 and within the openings 82 such that the anode contact 84 is in physical and electrical contact with a P+ injector layer 88 of the GTO 78. Since the N+ substrate 80 is not removed, the wafer can remain sufficiently thick to be easily handled during fabrication and have a higher mechanical stability. As a result, higher processing and packaging yields can be achieved. In addition, by not removing the N+ substrate 80 and by forming the openings 82 through the N+ substrate 80, various back-side processing steps (e.g., ion implantation and annealing) that could not be performed when using a fabrication process similar to the state-of-the-art process of FIGS. 2A through 2E can now be performed.

More specifically, as illustrated in FIG. 7, the GTO 78 includes the N+ substrate 80 and an epitaxial structure 90 grown on the N+ substrate 80. Both the N+ substrate 80 and the epitaxial structure 90 are formed of SiC. The epitaxial structure 90 includes the P+ injector layer 88 on, and preferably directly on, the N+ substrate 80, an N− drift layer 92 on, and preferably directly on, the P+ injector layer 88 opposite the N+ substrate 80, a P-type base layer 94 on, and preferably directly on, the N− drift layer 92 opposite the P+ injector layer 88, and N+ cathode regions 96 on, and preferably directly on, the P-type base layer 94 opposite the N− drift layer 92. Front-sides of the N+ cathode regions 96 and an exposed portion of the front-side of the P-type base layer 94 around the N+ cathode regions 96 are also referred to herein as a front-side of the wafer formed by the N+ substrate 80 and the epitaxial structure 90.

Cathode contacts 98 are on, and preferably directly on, the N+ cathode regions 96 opposite the P-type base layer 94. Gate contacts 100 are on, and preferably directly on, the P-type base layer 94 between the N+ cathode regions 96. Again, the anode contact 84 is on the back-side 86 of the N+ substrate 80, which is also referred to herein as a back-side of the wafer, and within the openings 82 through the N+ substrate 80. The openings 82 extend from the back-side 86 of the N+ substrate 80 to, and potentially into, the P+ injector layer 88. As such, the anode contact 84 is in physical and electrical contact with the P+ injector layer 88 through the openings 82. The cathode contacts 98, the gate contacts 100, and the anode contact 84 are formed of any suitable metal(s) and/or metal alloy(s).

Al doped regions 102 are formed at a back-side of the P+ injector layer 88. Notably, as compared to the IGBT 10 of FIG. 1 where ion implantation on the back-side of the wafer is not permissible due the very limited thermal budget after removing the N+ SiC substrate 36, the Al doped regions 102 can be formed via ion implantation through the openings 82 before performing any front-side processing steps that limit the thermal budget to a point that prohibits ion implantation and thermal annealing (e.g., before forming any of the contacts 98 or 100). This is possible due to the ease of handling the wafer and the improved mechanical stability of the wafer provided by the N+ substrate 80.

The Al doped regions 102 are aligned with the openings 82 and extend from within the P+ injector layer 88 to terminating ends 104 of the corresponding openings 82. The Al doped regions 102 are highly doped. In one preferred embodiment, a doping concentration of the Al doped regions 102 is greater than about $10^{19}$ dopants per cm$^3$ and more preferably in a range of and including about $10^{19}$-$10^{20}$ dopants per cm$^3$, whereas a doping concentration of the P+ injector layer 88 can be less than $10^{19}$ dopants per cm$^3$ or more preferably approximately $10^{18}$ dopants per cm$^3$ (e.g., $5\times10^{17}$ to $5\times10^{18}$ dopants per cm$^3$). Along with thermal annealing (e.g., Rapid Thermal Annealing) of the anode contact 84 in an optimal temperature range of 800-900° C., the Al doped regions 102 provide a good ohmic contact between the anode contact 84 and the P+ injector layer 88. Further, by providing the high Al doping concentration in the Al doped regions 102 via ion implantation rather than providing high Al doping via epitaxial growth as done in the IGBT 10, a low defect density in the P+ injector layer 88 is achieved. Note that while the Al doped regions 102 are doped with Al in this embodiment, other dopants may additionally or alternatively be used. Further, while the Al doped regions 102 are illustrated and described herein, as one alternative embodiment, the Al doped regions 102 may be replaced with a highly doped epitaxial layer between the N+ substrate 80 and the P+ injector layer 88.

Note that, in another embodiment, the P+ injector layer 88 of the GTO 78 may be electrically transparent, and the GTO 78 may further include an additional N− epitaxial layer between the N+ substrate 80 and the P+ injector layer 88 as discussed above with respect to the embodiment of the IGBT 38 illustrated in FIG. 6. It should also be noted that while the discussion of FIG. 7 relates to the GTO 78, the same structure can be used as an N-channel thyristor. The difference between the two structures is the dimension of the gate contacts 100 versus the dimensions of the N+ cathode regions 96. As an example, for one implementation of the GTO 78, the ratio of the gate area versus the cathode area is around 1:1. Conversely, in one implementation of an N-channel thyristor, the gate area is about $\frac{1}{10}^{th}$ or less of the cathode area.

FIG. 8 illustrates a PNP BJT 106 according to one embodiment of the present disclosure. In general, the BJT 106 is grown on an N+ substrate 108. Unlike the IGBT 10 fabricated according to the process of FIGS. 2A through 2E, the N+ substrate 108 is not removed. Rather, openings 110 are formed through the N+ substrate 108, and a collector contact 112 is formed on a back-side 114 of the N+ substrate 108 and within the openings 110 such that the collector contact 112 is in physical and electrical contact with a P+ collector 116 of the BJT 106. Since the N+ substrate 108 is not removed, the wafer can remain sufficiently thick to be easily handled during fabrication and have a higher mechanical stability. As a result, higher processing and packaging yields can be achieved. In addition, by not removing the N+ substrate 108 and by forming the openings 110 through the N+ substrate 108, various back-side processing steps (e.g., ion implantation and annealing) that could not be performed when using a fabrication process similar to the state-of-the-art process of FIGS. 2A through 2E can now be performed.

More specifically, as illustrated in FIG. 8, the BJT 106 includes the N+ substrate 108 and an epitaxial structure 118 grown on the N+ substrate 108. Both the N+ substrate 108 and the epitaxial structure 118 are formed of SiC. The epitaxial structure 118 includes the P+ collector 116 on, and preferably directly on, the N+ substrate 108, an P− drift layer 120 on, and preferably directly on, the P+ collector 116 opposite the N+ substrate 108, an N-type base layer 122 on, and preferably directly on, the P− drift layer 120 opposite the P+ collector 116, and P+ emitter regions 124 on, and preferably directly on, the N-type base layer 122 opposite the P− drift layer 120. Front-sides of the P+ emitter regions 124 and an exposed portion of the front-side of the N-type base layer 122 around the P+ emitter regions 124 are also referred to herein as a front-side of the wafer formed by the N+ substrate 108 and the epitaxial structure 118. N+ base regions 126 are formed (e.g., implanted) into the N-type base layer 122 at the front-side of the N-type base layer 122.

Emitter contacts 128 are on, and preferably directly on, the P+ emitter regions 124 opposite the N-type base layer 122. Base contacts 130 are on, and preferably directly on, the N-type base layer 122 between the P+ emitter regions 124. Again, the collector contact 112 is on the back-side 114 of the N+ substrate 108, which is also referred to herein as a back-side of the wafer, and within the openings 110 through the N+ substrate 108. The openings 110 extend from the back-side 114 of the N+ substrate 108 to, and potentially into, the P+ collector 116. As such, the collector contact 112 is in physical and electrical contact with the P+ collector 116 through the openings 110. The emitter contacts 128, the base contacts 130, and the collector contact 112 are formed of any suitable metal(s) and/or metal alloy(s).

Al doped regions 132 are formed at a back-side of the P+ collector 116. Notably, as compared to the IGBT 10 of FIG. 1 where ion implantation on the back-side of the wafer is not permissible due the very limited thermal budget after removing the N+ SiC substrate 36, the Al doped regions 132 can be formed via ion implantation through the openings 110 before performing any front-side processing steps that limit the thermal budget to a point that prohibits ion implantation and thermal annealing (e.g., before forming any of the contacts 128 and 130). This is possible due to the ease of handling the wafer and the improved mechanical stability of the wafer provided by the N+ substrate 108.

The Al doped regions 132 are aligned with the openings 110 and extend from within the P+ collector 116 to terminating ends 134 of the corresponding openings 110. The Al doped regions 132 are highly doped. In one preferred embodiment, a doping concentration of the Al doped regions 132 is greater than about $10^{19}$ dopants per cm$^3$ and more preferably in a range of and including about $10^{19}$-$10^{20}$ dopants per cm$^3$, whereas a doping concentration of the P+ collector 116 can be less than $10^{19}$ dopants per cm$^3$ or more preferably approximately $10^{18}$ dopants per cm$^3$ (e.g., $5\times10^{17}$ to $5\times10^{18}$ dopants per cm$^3$). Along with thermal annealing (e.g., Rapid Thermal Annealing) of the collector contact 112 in an optimal temperature range of 800-900° C., the Al doped regions 132 provide a good ohmic contact between the collector contact 112 and the P+ collector 116. Further, by providing the high Al doping concentration in the Al doped regions 132 via ion implantation rather than providing high Al doping via epitaxial growth as done in the IGBT 10, a low defect density in the P+ collector 116 is achieved. Note that while the Al doped regions 132 are doped with Al in this embodiment, other dopants may additionally or alternatively be used. Further, while the Al doped regions 132 are illustrated and described herein, as one alternative embodiment, the Al doped regions 132 may be replaced with a highly doped epitaxial layer between the N+ substrate 108 and the P+ collector 116.

Thus far, the semiconductor devices described have all been bipolar devices. However, the concepts disclosed herein are also applicable to unipolar devices. In this regard, FIG. 9 illustrates a P-channel MOSFET 136 according to one embodiment of the present disclosure. In general, the MOSFET 136 is grown on an N+ substrate 138. Unlike the IGBT 10 fabricated according to the process of FIGS. 2A through 2E, the N+ substrate 138 is not removed. Rather, openings 140 are formed through the N+ substrate 138, and a drain contact 142 of the MOSFET 136 is formed on a back-side 144 of the N+ substrate 138 and within the openings 140 such that the drain contact 142 is in physical and electrical contact with a P+ drain region 146 of the MOSFET 136. Since the N+ substrate 138 is not removed, the wafer can remain sufficiently thick to be easily handled during fabrication and have a higher mechanical stability. As a result, higher processing and packaging yields can be achieved. In addition, by not removing the N+ substrate 138 and by forming the openings 140 through the N+ substrate 138, various back-side processing steps (e.g., ion implantation and annealing) that could not be performed when using a fabrication process similar to the state-of-the-art process of FIGS. 2A through 2E can now be performed.

More specifically, as illustrated in FIG. 9, the MOSFET 136 includes the N+ substrate 138 and an epitaxial structure 148 grown on the N+ substrate 138. Both the N+ substrate 138 and the epitaxial structure 148 are formed of SiC. The epitaxial structure 148 includes the P+ drain region 146 on, and preferably directly on, the N+ substrate 138 and a P− drift layer 150 on, and preferably directly on, the P+ drain region 146 opposite the N+ substrate 138. N-type wells 152 are formed (e.g., implanted) within the P− drift layer 150 at a front-side 154 of the P− drift layer 150, which is also referred to herein as a front-side of the wafer. P+ regions 156, N+ regions 158, and P+ regions 160 are formed (e.g., implanted) within the N-type wells 152 as illustrated.

Gate contacts 162, which are insulated by insulating material 164, are on the front-side 154 of the P− drift layer 150 over regions of the P− drift layer 150 between the N-type wells 152. A source contact 166 is on, and preferably directly on, the P+, N+, and P+ regions 156, 158, and 160, which form corresponding source regions of the MOSFET 136. Again, the drain contact 142 is on the back-side 144 of the N+ substrate 138, which is also referred to herein as a back-side of the wafer, and within the openings 140 through the N+ substrate 138. The openings 140 extend from the back-side 144 of the N+ substrate 138 to, and potentially into, the P+ drain region 146. As such, the drain contact 142 is in physical and electrical contact with the P+ drain region 146 through the openings 140. The gate contacts 162, the source contact 166, and the drain contact 142 are formed of any suitable metal(s) and/or metal alloy(s).

Al doped regions 168 are formed at a back-side of the P+ drain region 146. Notably, as compared to the IGBT 10 of FIG. 1 where ion implantation on the back-side of the wafer is not permissible due the very limited thermal budget after removing the N+SiC substrate 36, the Al doped regions 168 can be formed via ion implantation through the openings 140 before performing any front-side processing steps that limit the thermal budget to a point that prohibits ion implantation and thermal annealing (e.g., before forming any of the contacts 162 and 166). This is possible due to the ease of handling the wafer and the improved mechanical stability of the wafer provided by the N+ substrate 138.

The Al doped regions 168 are aligned with the openings 140 and extend from within the P+ drain region 146 to terminating ends 170 of the corresponding openings 140. The Al doped regions 168 are highly doped. In one preferred embodiment, a doping concentration of the Al doped regions 168 is greater than about $10^{19}$ dopants per cm$^3$ and more preferably in a range of and including about $10^{19}$-$10^{20}$ dopants per cm$^3$, whereas a doping concentration of the P+ drain region 146 can be less than $10^{19}$ dopants per cm$^3$ or more preferably approximately $10^{18}$ dopants per cm$^3$ (e.g., $5\times10^{17}$ to $5\times10^{18}$ dopants per cm$^3$). Along with thermal annealing (e.g., Rapid Thermal Annealing) of the drain contact 142 in an optimal temperature range of 800-900° C., the Al doped regions 168 provide a good ohmic contact between the drain contact 142 and the P+ drain region 146. Further, by providing the high Al doping concentration in the Al doped regions 168 via ion implantation rather than providing high Al doping via epitaxial growth as done in the IGBT 10, a low defect density in the P+ drain region 146 is achieved. Note that while the Al doped regions 168 are doped with Al in this embodiment, other dopants may additionally or alternatively be used. Further, while the Al doped regions 168 are illustrated and described herein, as one alternative embodiment, the Al doped regions 168 may be replaced with a highly doped epitaxial layer between the N+ substrate 138 and the P+ drain region 146.

Those skilled in the art will recognize improvements and modifications to the preferred embodiments of the present disclosure. All such improvements and modifications are considered within the scope of the concepts disclosed herein and the claims that follow.

What is claimed is:

1. A semiconductor device comprising:
    an N-type Silicon Carbide substrate;
    an epitaxial structure on a first side of the N-type Silicon Carbide substrate, the epitaxial structure comprising a P-type Silicon Carbide layer adjacent to the N-type Silicon Carbide substrate;
    a plurality of spaced apart highly doped regions formed in the P-type Silicon Carbide layer;
    one or more openings through the N-type Silicon Carbide substrate corresponding to the plurality of spaced apart highly doped regions the that extend from a second side of the N-type Silicon Carbide substrate to the P-type Silicon Carbide layer in the epitaxial structure, the second side of the N-type Silicon Carbide substrate being opposite the first side of the N-type Silicon Carbide substrate;
    a first contact on the epitaxial structure opposite the N-type Silicon Carbide substrate; and
    a second contact on the second side of the N-type Silicon Carbide substrate and within the one or more openings through the N-type Silicon Carbide substrate such that the second contact is in physical and electrical contact with the P-type Silicon Carbide layer;
    wherein, in a forward conduction state of the semiconductor device, current flows between the first contact and the second contact through the epitaxial structure.

2. The semiconductor device of claim 1 wherein the one or more openings expose greater than or equal to about 40% of the P-type Silicon Carbide layer but less than all of the P-type Silicon Carbide layer.

3. The semiconductor device of claim 1 wherein the one or more openings expose greater than or equal to about 50% of the P-type Silicon Carbide layer and up to all of the P-type Silicon Carbide layer within an active region of the semiconductor device.

4. The semiconductor device of claim 1 wherein a total thickness of the N-type Silicon Carbide substrate and the epitaxial structure is greater than or equal to about 250 microns.

5. The semiconductor device of claim 1 wherein: for each opening of the one or more openings through the N-type Silicon Carbide substrate, a corresponding one of the plurality of spaced apart highly doped regions is aligned with the opening and extends from within the P-type Silicon Carbide layer to the P-type Silicon Carbide layer such that the second contact is in physical and electrical contact with the one of the plurality of highly doped regions within the opening.

6. The semiconductor device of claim 5 wherein, for each opening of the one or more openings through the N-type Silicon Carbide substrate, the corresponding one of the plurality of spaced apart highly doped regions is highly doped with Aluminum such that the second contact forms an ohmic contact to the P-type Silicon Carbide layer.

7. The semiconductor device of claim 1 wherein the semiconductor device is an N-channel bipolar device, and the P-type Silicon Carbide layer is an injector layer that injects minority carriers during a forward conduction state of the N-channel bipolar device.

8. The semiconductor device of claim 7 wherein the N-channel bipolar device is one of a group consisting of: an N-channel Insulated Gate Bipolar Transistor, an N-channel Gate Turn-Off thyristor, and an N-channel thyristor.

9. The semiconductor device of claim 1 wherein the semiconductor device is a PNP Bipolar Junction Transistor (BJT), and the P-type Silicon Carbide layer is a collector of the PNP BJT.

10. The semiconductor device of claim 1 wherein the semiconductor device is a P-channel Metal Oxide Semiconductor Field Effect Transistor, and the P-type Silicon Carbide layer is a drain region of the P-channel Metal Oxide Semiconductor Field Effect Transistor.

11. The semiconductor device of claim 1 wherein the semiconductor device is a bipolar device, the P-type Silicon Carbide layer is an electrically transparent injector layer that injects minority carriers during a forward conduction state of the bipolar device, and the epitaxial structure of the bipolar device further comprises:
    an N-type epitaxial layer between the P-type Silicon Carbide layer and the N-type Silicon Carbide substrate;
    wherein the one or more openings through the N-type Silicon Carbide substrate extend from the second side of the N-type Silicon Carbide substrate through the N-type epitaxial layer to the P-type Silicon Carbide layer in the epitaxial structure.

12. The semiconductor device of claim 1 wherein the P-type Silicon Carbide layer is directly on the N-type Silicon Carbide substrate.

13. A method of fabricating a semiconductor device, comprising: providing an epitaxial structure on a first side of an N-type Silicon Carbide substrate, the epitaxial structure comprising a P-type Silicon Carbide layer adjacent to the N-type Silicon Carbide substrate; forming one or more openings through the N-type Silicon Carbide substrate that extend from a second side of the N-type Silicon Carbide substrate to the P-type Silicon Carbide layer in the epitaxial structure, the one or more openings exposing greater than or equal to about 40% of the P-type Silicon Carbide layer; forming a plurality of spaced apart highly doped regions in the P-type Silicon Carbide layer through the one or more openings; and providing a contact on the second side of the N-type Silicon Carbide substrate and within the one or more openings through the N-type Silicon Carbide substrate such that the contact is in physical and electrical contact with the P-type Silicon Carbide layer.

14. The method of claim 13 wherein forming the one or more openings through the N-type Silicon Carbide substrate comprises:
    thinning the N-type Silicon Carbide substrate; and
    after thinning the N-type Silicon Carbide substrate, etching the N-type Silicon Carbide substrate to form the one or more openings through the N-type Silicon Carbide substrate that extend from the second side of the N-type Silicon Carbide substrate to the P-type Silicon Carbide layer in the epitaxial structure.

15. The method of claim 13 wherein forming the one or more openings through the N-type Silicon Carbide substrate comprises forming the one or more openings through the N-type Silicon Carbide substrate such that the one or more openings expose greater than or equal to about 40% of the P-type Silicon Carbide layer but less than all of the P-type Silicon Carbide layer.

16. The method of claim 13 wherein forming the one or more openings through the N-type Silicon Carbide substrate comprises forming the one or more openings through the N-type Silicon Carbide substrate such that the one or more openings expose greater than or equal to about 50% of the P-type Silicon Carbide layer and up to all of the P-type Silicon Carbide layer within an active region of the semiconductor device.

17. The method of claim 13 wherein a total thickness of the N-type Silicon Carbide substrate and the epitaxial structure is greater than or equal to about 250 microns.

18. The method of claim 13 wherein providing the contact comprises providing the contact on the second side of the N-type Silicon Carbide substrate and within the one or more openings such that the contact is in physical and electrical contact with the one or more of spaced apart highly doped regions within the one or more openings.

19. The method of claim 18 wherein the one or more of spaced apart highly doped regions are highly doped with Aluminum such that the contact forms an ohmic contact to the P-type Silicon Carbide layer.

20. The method of claim 13 wherein the semiconductor device is an N-channel bipolar device, and the P-type Silicon Carbide layer is an injector layer that injects minority carriers during a forward conduction state of the N-channel bipolar device.

21. The method of claim 20 wherein the N-channel bipolar device is one of a group consisting of: an N-channel Insulated Gate Bipolar Transistor, an N-channel Gate Turn-Off thyristor, or an N-channel thyristor.

22. The method of claim 13 wherein the semiconductor device is a PNP Bipolar Junction transistor (BJT), and the P-type Silicon Carbide layer is a collector of the PNP BJT.

23. The method of claim 13 wherein the semiconductor device is a P-channel Metal Oxide Semiconductor Field Effect Transistor, and the P-type Silicon Carbide layer is a drain region of the P-channel Metal Oxide Semiconductor Field Effect Transistor.

24. The method of claim 13 wherein the semiconductor device is a bipolar device, the P-type Silicon Carbide layer is an electrically transparent injector layer that injects minority carriers during a forward conduction state of the bipolar device, and providing the epitaxial structure on the first side of the N-type Silicon Carbide substrate comprises:

providing an N-type Silicon Carbide layer on the N-type Silicon Carbide substrate; and providing the P-type Silicon Carbide layer on the N-type Silicon Carbide layer opposite the N-type Silicon Carbide substrate;

wherein the one or more openings through the N-type Silicon Carbide substrate extend from the second side of the N-type Silicon Carbide substrate through the N-type Silicon Carbide layer to the P-type Silicon Carbide layer in the epitaxial structure.

25. The method of claim 13 wherein providing the epitaxial structure on the first side of the N-type Silicon Carbide substrate comprises providing the P-type Silicon Carbide layer directly on the N-type Silicon Carbide substrate.

* * * * *